(12) United States Patent
Inai et al.

(10) Patent No.: US 9,837,260 B2
(45) Date of Patent: Dec. 5, 2017

(54) CLEANING METHOD, PROCESSING APPARATUS, AND STORAGE MEDIUM

(75) Inventors: Kensuke Inai, Nirasaki (JP); Kazuya Dobashi, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 611 days.

(21) Appl. No.: 14/232,989

(22) PCT Filed: Jul. 12, 2012

(86) PCT No.: PCT/JP2012/004521
§ 371 (c)(1),
(2), (4) Date: Jan. 15, 2014

(87) PCT Pub. No.: WO2013/011673
PCT Pub. Date: Jan. 24, 2013

(65) Prior Publication Data
US 2014/0227882 A1 Aug. 14, 2014

(30) Foreign Application Priority Data
Jul. 19, 2011 (JP) .................................. 2011-157955

(51) Int. Cl.
*B08B 5/00* (2006.01)
*H01L 21/02* (2006.01)
(Continued)

(52) U.S. Cl.
CPC .. *H01L 21/02057* (2013.01); *H01L 21/02046* (2013.01); *H01L 21/02068* (2013.01);
(Continued)

(58) Field of Classification Search
CPC ......... H01L 21/02057; H01L 21/02046; H01L 21/02068; H01L 21/3086; H01L 21/67028;
(Continued)

(56) References Cited

U.S. PATENT DOCUMENTS 5,512,106 A * 4/1996 Tamai ....................... B08B 7/00
134/2
6,449,873 B1 9/2002 Yoon
(Continued)

FOREIGN PATENT DOCUMENTS

CN 102770942 A 11/2012
JP 2001-137797 A 5/2001
(Continued)

OTHER PUBLICATIONS

International Search Report for Application No. PCT/JP2012/004521 dated Aug. 28, 2012.

*Primary Examiner* — Sharidan Carrillo
(74) *Attorney, Agent, or Firm* — Pearne & Gordon LLP

(57) ABSTRACT

Deposits such as particles deposited on a surface of a target object can be easily removed while suppressing damage to the target object such as destruction of pattern formed on the surface of the target object or film roughness on the surface of the target object. In a pre-treatment, vapor of a hydrogen fluoride is supplied to a wafer W to dissolve a natural oxide film 11, so that a deposit 10 attached to a surface of the natural oxide film 11 is slightly separated from a surface of the wafer W. A carbon dioxide gas that does not react with an underlying film 12 is supplied to a processing gas atmosphere where the wafer W is placed, so that a gas cluster of the carbon dioxide gas is generated. Then, the gas cluster in a non-ionized state is irradiated toward the wafer W to remove the deposit 10.

9 Claims, 27 Drawing Sheets

(51) Int. Cl.
*H01L 21/67* (2006.01)
*H01L 21/308* (2006.01)

(52) U.S. Cl.
CPC .... *H01L 21/3086* (2013.01); *H01L 21/67028* (2013.01); *H01L 21/67051* (2013.01); *H01L 21/67069* (2013.01); *H01L 21/67115* (2013.01)

(58) Field of Classification Search
CPC ......... H01L 21/67051; H01L 21/67069; H01L 21/67115; B08B 7/00; B08B 7/0035; B08B 7/0042
See application file for complete search history.

(56) References Cited

U.S. PATENT DOCUMENTS

| | | | |
|---|---|---|---|
| 6,689,284 B1 | 2/2004 | Nakasaki | |
| 2004/0157456 A1* | 8/2004 | Hall | H01L 21/02074 438/692 |
| 2005/0155951 A1* | 7/2005 | Suzuki | B81C 1/00531 216/66 |
| 2010/0029071 A1* | 2/2010 | Russell | H01L 21/02068 438/514 |
| 2010/0193472 A1* | 8/2010 | Tabat | C23C 14/221 216/94 |
| 2012/0252222 A1* | 10/2012 | Gumpher | H01L 21/26506 438/758 |
| 2013/0008470 A1 | 1/2013 | Dobashi | |
| 2013/0059445 A1* | 3/2013 | Shao | H01L 21/3065 438/707 |

FOREIGN PATENT DOCUMENTS

| | | |
|---|---|---|
| JP | 2001-168076 A | 6/2001 |
| JP | 2006-278387 A | 10/2006 |
| JP | 2008-124356 A | 5/2008 |
| JP | 2008-227283 A | 9/2008 |
| JP | 2008-251743 A | 10/2008 |
| JP | 2008-304737 A | 12/2008 |
| JP | 2009-029691 A | 2/2009 |
| JP | 2009-043975 A | 2/2009 |
| JP | 2009-224721 A | 10/2009 |
| TW | 200741825 A | 11/2007 |
| WO | 2010/021265 A1 | 2/2010 |

* cited by examiner

FIG. 27
Ar (100%) GAS CLUSTER
BEFORE IRRADIATION
AFTER IRRADIATION
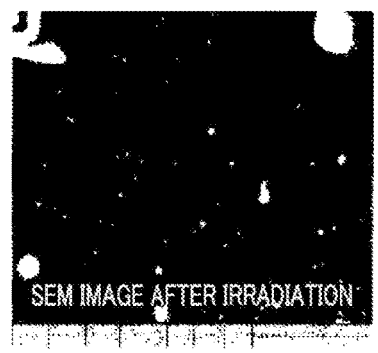
FIG. 28
Ar (95%)/HF (5%) GAS CLUSTER
BEFORE IRRADIATION
AFTER IRRADIATION
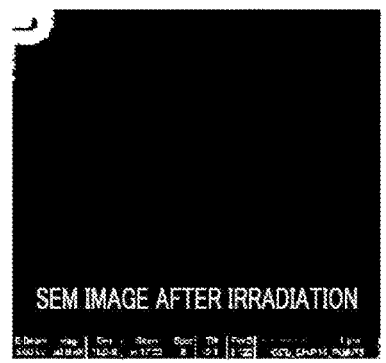

US 9,837,260 B2

CLEANING METHOD, PROCESSING APPARATUS, AND STORAGE MEDIUM

CROSS-REFERENCE TO RELATED APPLICATION

This Application is a U.S. national phase application under 35 U.S.C. §371 of PCT Application No. PCT/JP2012/004521 filed on Jul. 12, 2012, which claims the benefit of Japanese Patent Application No. 2011-157955 filed on Jul. 19, 2011, the entire disclosures of which are incorporated herein by reference.

TECHNICAL FIELD

The embodiments described herein pertain generally to a cleaning method and a processing apparatus for removing deposits such as particles deposited on a surface of a target object, and a storage medium that stores the method therein.

BACKGROUND

As a technology of removing deposits, for example, particles or contaminants, deposited on a surface of a substrate (hereinafter, referred to as "wafer") as a target object, for example, a semiconductor wafer, there are known methods described in, for example, Patent Documents 1 and 2. In Patent Documents 1 and 2, it is described that a gas cluster ion beam is irradiated onto a surface of the wafer. In this technology, in order to overcome adhesive strength of the deposits to the wafer, for example, a physical shearing force of the gas cluster ion beam is adjusted by an acceleration voltage or an ionized amount.

However, along with miniaturization of a device structure formed on a wafer, the device structure can be easily damaged by a gas cluster ion beam. That is, by way of example, when a gas cluster ion beam is irradiated to a pattern having grooves and lines on a wafer, if a width of the line is, for example, several tens nm order, there is a risk that the line may be damaged by the irradiation of the gas cluster ion beam. Further, even if the pattern is not formed, after the gas cluster ion beam is irradiated, a surface shape of the wafer may be deteriorated.

Patent Document 3 describes a technology of removing a natural oxide film on a substrate with a chemical liquid and jetting air applied with ultrasonic vibration, and Patent Document 4 describes a technology of irradiating a pulsed laser onto a surface of a substrate. However, in Patent Documents 3 and 4, there is no description about removal of particles from a miniaturized device structure or damage to a wafer.

REFERENCES

Patent Document 1: Japanese Patent Laid-open Publication No. 2009-043975
Patent Document 2: Japanese Patent Laid-open Publication No. 2008-304737
Patent Document 3: Japanese Patent Laid-open Publication No. 2006-278387
Patent Document 4: Japanese Patent Laid-open Publication No. 2009-224721

DISCLOSURE OF THE INVENTION

Problems to be Solved by the Invention

In view of the foregoing problems, example embodiments provide a cleaning method and a processing apparatus capable of easily removing deposits such as particles deposited on a surface of a target object while suppressing damage to the target object, and a storage medium that stores the method therein.

Means for Solving the Problems

In one example embodiment, a cleaning method of removing a deposit from a surface of a target object to which the deposit is attached includes: performing a pre-treatment including an etching process on at least one of the surface of the target object and the deposit; generating a gas cluster as an atomic or molecular cluster of a cleaning gas by discharging the cleaning gas, which does not react with a film exposed at the surface of the target object, at a processing gas atmosphere where the target object is placed from a region having a higher pressure than the processing gas atmosphere and adiabatically expanding the cleaning gas; and removing the deposit by irradiating the gas cluster of the cleaning gas to the surface of the target object on which the pre-treatment is performed.

The pre-treatment may include a modification process of modifying at least one of the surface of the target object and the deposit, and an etching process of etching a modification layer modified by the modification process. Further, the performing of the pre-treatment and the removing of the deposit may be performed at the same time. Furthermore, the pre-treatment may include an irradiation process of irradiating the gas cluster to perform the etching process.

The irradiation process of irradiating the gas cluster to perform the etching process may be performed by using a generating device identical to or different from a generating device that irradiates the gas cluster in the removing of the deposit by irradiating the gas cluster of the cleaning gas. Further, in the removing of the deposit by irradiating the gas cluster of the cleaning gas and the irradiation process of irradiating the gas cluster to perform the etching process, multiple generating devices each irradiating the gas cluster may be provided, and the gas cluster may be irradiated from the generating devices. Moreover, in the removing of the deposit by irradiating the gas cluster of the cleaning gas and the irradiation process of irradiating the gas cluster to perform the etching process, an angle of a generating device that irradiates the gas cluster with respect to the target object may be variable.

In another example embodiment, a processing apparatus that removes a deposit from a surface of a target object to which the deposit is attached includes: a pre-treatment chamber in which the target object is mounted; a pre-treatment module including a pre-treatment device configured to perform a pre-treatment having an etching process on at least one of the surface of the target object mounted in the pre-treatment chamber and the deposit; a cleaning chamber in which the target object is mounted; a gas cluster nozzle that is provided within the cleaning chamber, and configured to discharge a cleaning gas, which does not react with a film exposed at the surface of the target object, at a processing gas atmosphere within the cleaning chamber from a region having a higher pressure than the processing gas atmosphere to adiabatically expand the cleaning gas and generate the gas cluster as an atomic or molecular cluster of the cleaning gas, and configured to supply the gas cluster to the target object, on which the pre-treatment is performed, in order to remove the deposit; and a transfer device configured to transfer the target object into the pre-treatment chamber and the cleaning chamber.

The pre-treatment chamber may be a normal pressure processing chamber in which a pressure is maintained at a normal pressure atmosphere, and the pre-treatment chamber may be connected to a normal pressure transfer chamber configured to transfer the target object under the normal pressure atmosphere. The cleaning chamber may be a vacuum processing chamber in which a pressure is maintained at a vacuum pressure atmosphere, and the cleaning chamber is airtightly connected to a vacuum transfer chamber configured to transfer the target object under the vacuum pressure atmosphere. A load-lock chamber may be provided between the normal pressure transfer chamber and the vacuum transfer chamber and may be configured to switch an internal atmosphere thereof. A normal pressure transfer device and a vacuum transfer device as the transfer device may be provided in the normal pressure transfer chamber and the vacuum transfer chamber, respectively. Further, the pre-treatment chamber and the cleaning chamber may be vacuum processing chambers in which pressures are maintained at a vacuum pressure atmosphere, and a vacuum transfer chamber including the transfer device may be airtightly interposed between the pre-treatment chamber and the cleaning chamber. Furthermore, the pre-treatment chamber and the cleaning chamber may be provided as a common single chamber. Moreover, the vacuum transfer chamber may be airtightly connected to the vacuum processing chamber configured to perform a vacuum process before the pre-treatment or perform a vacuum process after the deposit is removed.

In still another example embodiment, a computer-readable storage medium has stored thereon computer-executable instructions that, in response to execution, cause a processing apparatus to perform the cleaning method as described above.

Effect of the Invention

In accordance with the example embodiments, a pre-treatment including an etching process is performed on at least one of a surface of a target object and a deposit, so that the deposit is easily separated from the surface of the target object. Then, a gas cluster is generated by using a cleaning gas which does not react with a film exposed on the surface of the target object. Therefore, even if the gas cluster of the cleaning gas is irradiated while being not ionized, the deposit can be easily separated and removed from the target object. Thus, it is possible to easily remove the deposit while suppressing damage to the target object.

BRIEF DESCRIPTION OF THE DRAWINGS

FIG. 27 provides SEM images showing an experimental result obtained from an experimental example.

FIG. 28 provides SEM images showing an experimental result obtained from an experimental example.

MODE FOR CARRYING OUT THE INVENTION

First Example Embodiment: Silicon Substrate

Figure 1:
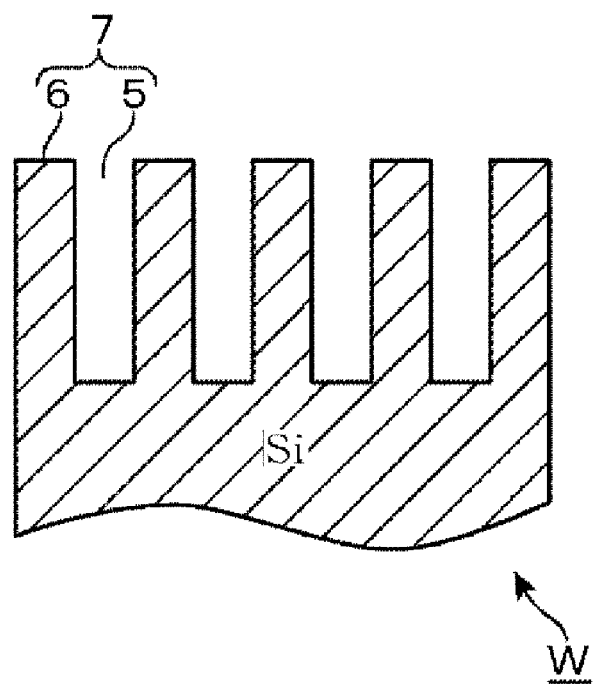
FIG. 1 is a schematic diagram showing a target object to which a cleaning method in accordance with a first example embodiment is applied.
Figure 2:
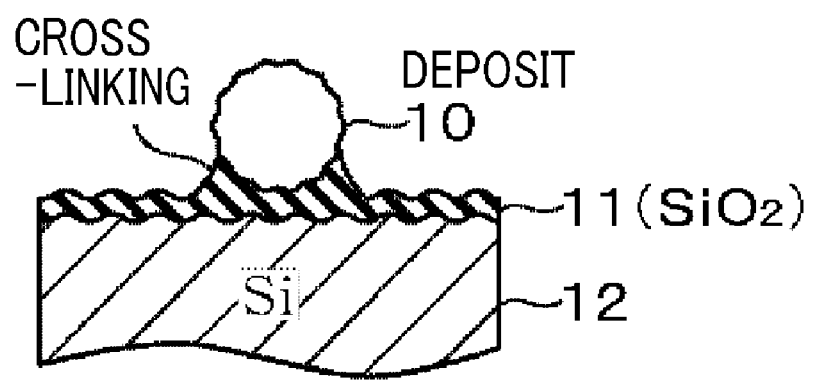
FIG. 2 is a schematic diagram showing the target object.

A first example embodiment of a cleaning method will be explained with reference to FIG. 1 to FIG. 5. Above all, a configuration of a wafer W to which the cleaning method is applied, and the cleaning method will be explained briefly. The wafer W is made of silicon (Si) as depicted in FIG. 1, and a pattern 7 having, for example, grooves 5 as recessed portions and lines 6 as protruded portions is formed on a surface of the wafer W. Further, according to the cleaning method, a deposit 10 on the surface of the wafer W as depicted in FIG. 2 can be easily removed while suppressing occurrence of damage to the wafer W such as destruction of the lines 6 or film roughness on the surface of the wafer W as described below.

Hereinafter, the deposit 10 will be explained in detail. The deposit 10 is, for example, a residual material generated by a plasma etching process in which the pattern 7 is formed on the wafer W or a plasma ashing process which is preformed after the plasma etching process. To be specific, the deposit 10 may be formed of an inorganic material including silicon that is removed from the inside of the groove 5 or an organic material including carbon (C) as a residue of a photoresist mask that is stacked on an upper layer of the wafer W and made of an organic material. Herein, for example, since the wafer W in storage is exposed to atmosphere, the deposit 10 is not simply placed on the surface of the wafer W but is surrounded by a natural oxide film formed on the surface of the wafer W to be strongly attached thereon as depicted in FIG. 2 in a microscopic view. That is, for example, a natural oxide film is formed on the surface of the wafer W to surround the deposit 10, and the deposit 10 is buried in the natural oxide film accordingly. That is, the deposit 10 is held on the wafer W by being cross-linked on the surface of the wafer W.

In this case, the surface of the wafer W is oxidized, e.g., when the wafer W is transferred in the atmosphere, so that a natural oxide film 11 made of a silicon oxide $SiO_2$ is formed thereon. A thickness of the natural oxide film 11 is, for example, about 1 nm. A portion made of silicon and positioned under the natural oxide film 11 will be referred to as an underlying film 12. Although the surface of the wafer W and the deposit 10 may be chemically bonded and connected to each other, there will be explained a case where the deposit 10 is held on the wafer W by being cross-linked therebetween as described above, for the sake of simplicity of explanation. Further, surface shapes and sizes of the wafer W and the deposit 10 are schematically depicted in FIG. 1 and will be the same in the subsequent drawings.

Figure 3:
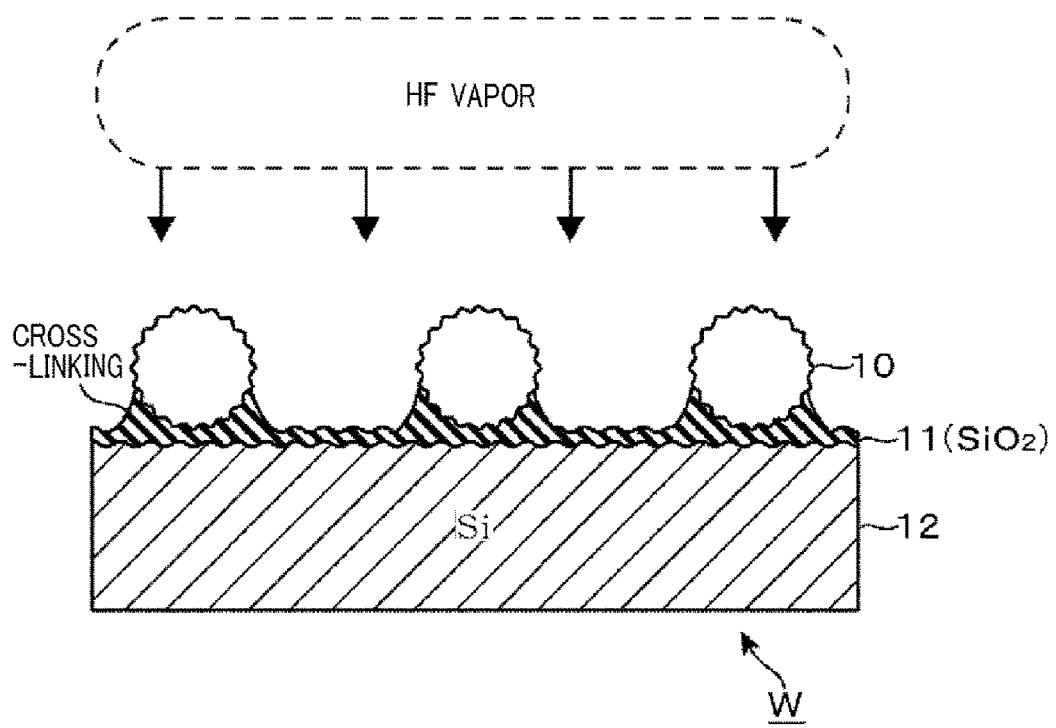
FIG. 3 is a schematic diagram showing an operation of the cleaning method.
Figure 4:
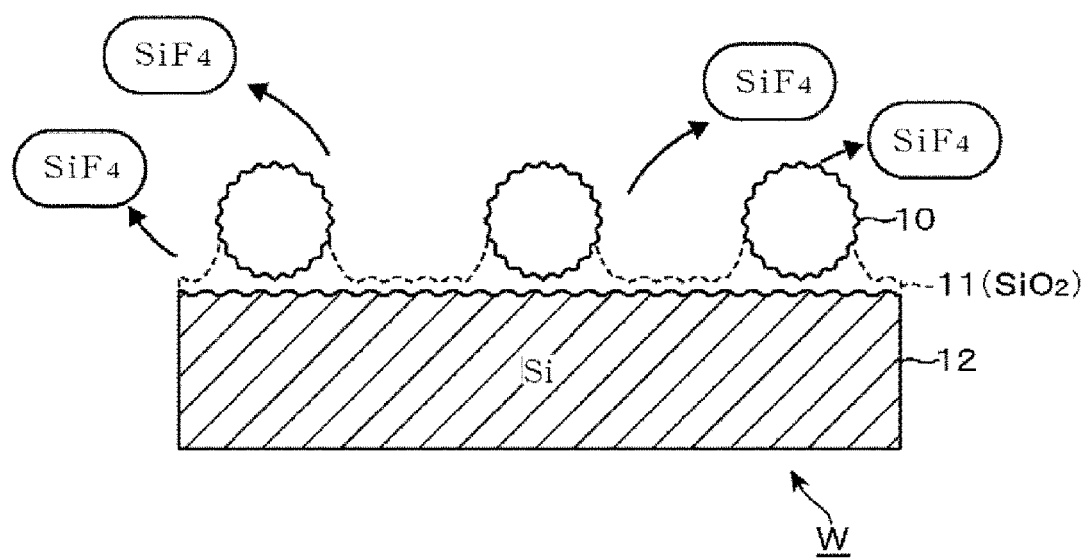
FIG. 4 is a schematic diagram showing an operation of the cleaning method.

Hereinafter, the cleaning method in the present example embodiment will be explained. As depicted in FIG. 3, in a pre-treatment, vapor of a hydrogen fluoride aqueous solution is supplied to the wafer W. The natural oxide film 11 is dissolved by the vapor of the hydrogen fluoride to become silicon tetrafluoride, and then exhausted in the form of a gas. In this case, the cross-linking between the wafer W and the deposit 10 is also etched. As depicted in FIG. 4, the surface of the wafer W is retreated in a downward direction as viewed from the deposit 10, and a surface of the deposit 10 becomes exposed.

Therefore, the adhesive strength of the wafer W to the deposit 10, which is buried in the natural oxide film on the surface of the wafer W and strongly attached to the wafer W, is reduced through the pre-treatment. That is, since the surface of the wafer W is etched, the deposit 10 becomes exposed to be in slight contact with the surface of the wafer W. In this case, as described below, if the deposit 10 contains a silicon oxide, the deposit 10 is also etched by the vapor of the hydrogen fluoride. Herein, however, only the surface of the wafer W is focused and explained. Although an upper surface of the wafer W (underlying film 12) and a lower surface of the deposit 10 are illustrated as being separated from each other, the underlying film 12 and the deposit 10 are actually in slight contact with each other. A device that supplies the vapor of the hydrogen fluoride to the wafer W is formed by combining a well-known vaporizer with a processing chamber, and thus, will be explained later together with a processing apparatus that performs the cleaning method.

Figure 5:
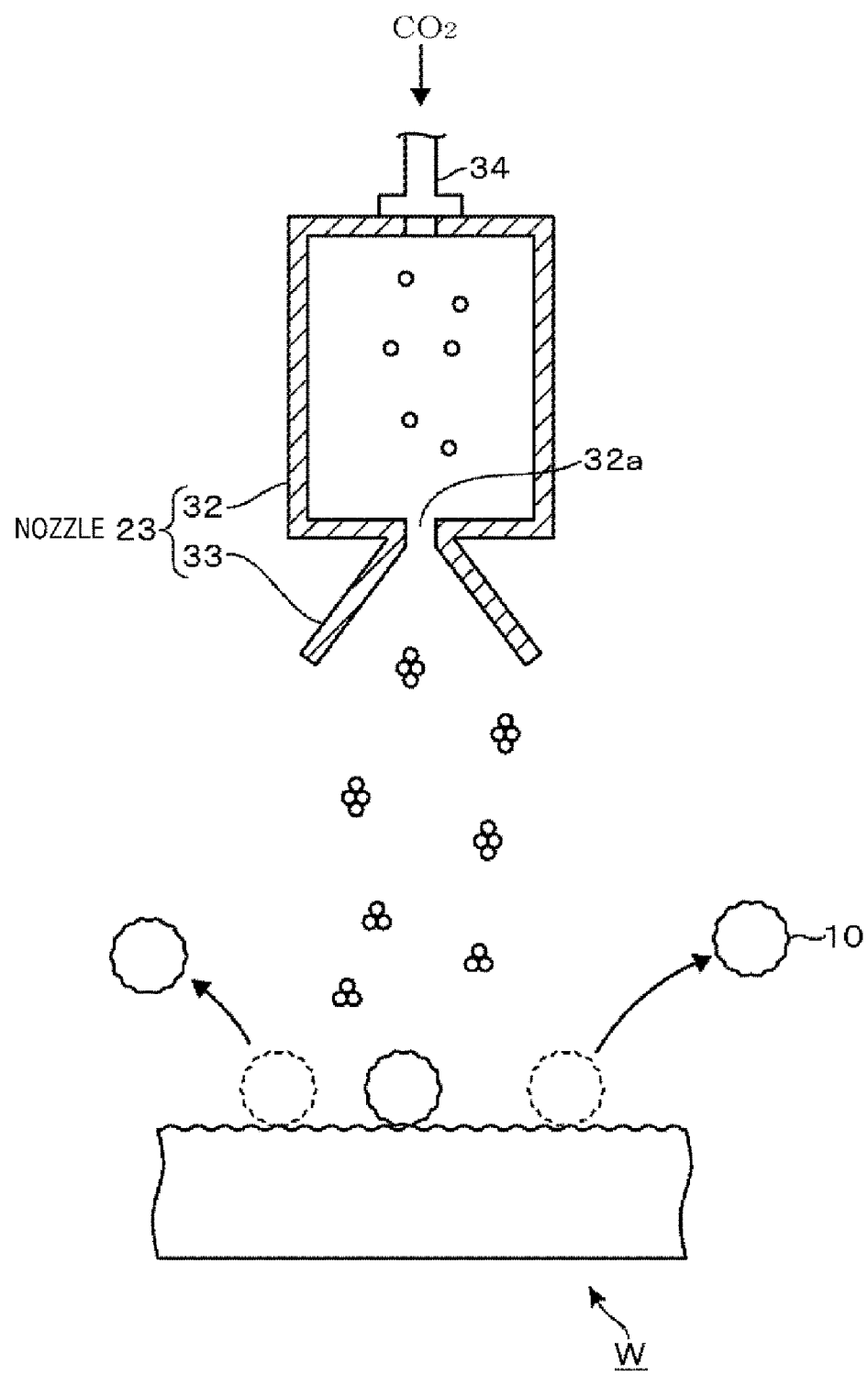
FIG. 5 is a schematic diagram showing an operation of the cleaning method.

Then, the deposit 10 is removed from the surface of the wafer W by using a gas cluster. A gas is supplied to a processing gas atmosphere where the wafer W is placed from a region having a higher pressure than the processing gas atmosphere. Then the gas is adiabatically expanded to be cooled to the condensation temperature of the gas. As a result, the gas cluster is generated as an atomic or molecular cluster of the gas. FIG. 5 illustrates an example of a nozzle 23 configured to generate the gas cluster. The nozzle 23 includes a pressure room 32 having a substantially cylindrical shape, and a gas diffusing portion 33 connected to the lower end portion of the pressure room 32. The pressure room 32 is vertically extended, and a lower end portion of the pressure room 32 is opened. The gas diffusing portion 33 includes an orifice portion 32a formed by being horizontally extended from the periphery of the lower end portion of the pressure room 32 toward a central portion of the pressure room 32. Further, the gas diffusing portion 33 has a shape in which the diameter thereof is increased downwardly from the orifice portion 32a. An opening diameter of the orifice portion 32a and a distance between the orifice portion 32a and the wafer W on a mounting table 22 are, for example, about 0.1 mm and about 6.5 mm, respectively. An upper end portion of the nozzle 23 is connected to a gas supply line 34 through which, for example, a carbon dioxide ($CO_2$) gas is supplied into the pressure room 32.

A process pressure in the processing gas atmosphere is set to be a vacuum atmosphere in a range of, for example, from about 1 Pa to about 100 Pa, and the carbon dioxide gas is supplied to the nozzle 23 at a pressure in a range of, for example, from about 0.3 MPa to about 2.0 MPa. When the carbon dioxide gas is supplied to the processing gas atmosphere, it is cooled to have a temperature equal to or lower than the condensation temperature thereof by the rapid adiabatic expansion, and, thus, molecules are bonded to each other by a van der Waals force to become a gas cluster. In this case, at the gas supply line 34 or a gas cluster flow path under the nozzle 23, an ionization device configured to ionize the gas cluster is not provided. Therefore, the gas cluster in a non-ionized state is vertically irradiated toward the wafer W as depicted in FIG. 5.

As described above, the deposit 10 on the surface of the wafer W has a very weakened adhesive strength with respect to the wafer W through the pre-treatment and becomes in slight contact with the surface of the underlying film 12. Therefore, if the deposit 10 on the wafer W collides with the gas cluster, the deposit 10 is blown away and removed from the surface of the wafer W by an injection pressure of the gas cluster as depicted in FIG. 5. In this case, the gas cluster is composed of a carbon dioxide gas that does not react with the underlying film 12. Further, the gas cluster is not ionized, and the gas cluster in a non-ionized state is irradiated to the wafer W. Therefore, the underlying film 12 as the surface of the wafer W exposed through the pre-treatment can be suppressed from being removed by the irradiation of the gas cluster. Further, there is no risk that electric wirings formed within the underlying film 12 are electrically charged up. Therefore, it is possible to suppress damage to the electric wirings from being generated, or to allow the damage, if any, to be a very low level. For this reason, after the gas cluster is irradiated, the surface of the wafer W is patterned after the surface of the natural oxide film 11.

If the wafer W is moved in a relatively horizontal direction with respect to the nozzle 23 in order for the gas cluster to be irradiated throughout an entire surface of the wafer W, the deposit 10 is removed throughout the entire surface of the wafer W and a cleaning process is carried out. Further, if there is generated water as a by-product from the natural oxide film 11 dissolved by the vapor of the hydrogen fluoride, the wafer W is heated by a temperature controller to be described later. Thus, it is possible to suppress water from remaining.

Figure 6:
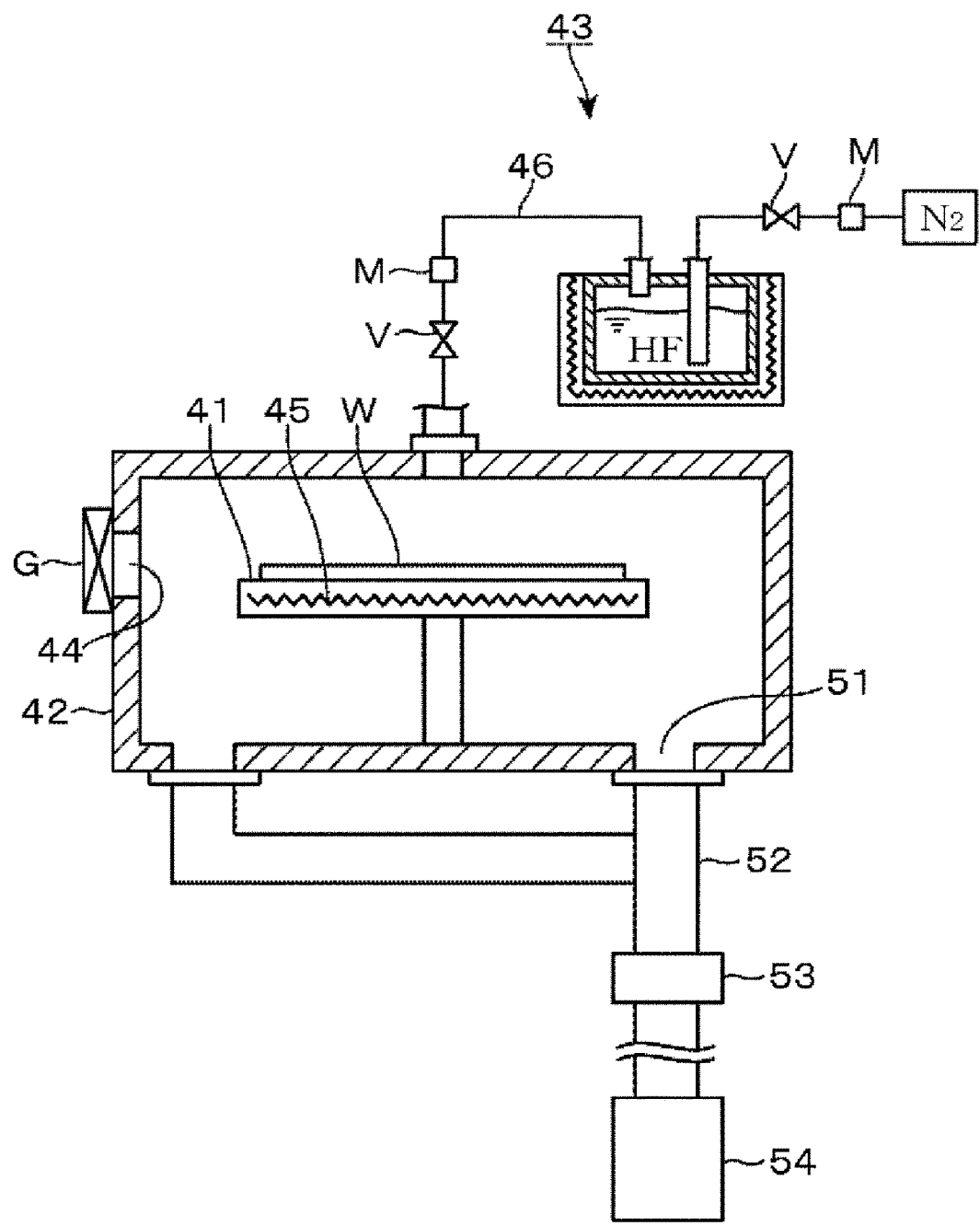
FIG. 6 is a longitudinal cross sectional view showing a device that performs a pre-treatment onto the target object.

Hereinafter, a processing apparatus including the device that supplies the vapor of the hydrogen fluoride aqueous solution to the wafer W or a device that irradiates the gas cluster to the wafer W will be explained. The device that supplies the vapor of the hydrogen fluoride to the wafer W will be explained first with reference to FIG. 6. In this device, a pre-treatment module includes a processing chamber 42 accommodating therein a mounting table 41 configured to mount the wafer W thereon and a vaporizer 43 as a pre-treatment unit configured to supply the vapor of the hydrogen fluoride into the processing chamber 42. In FIG. 6, a reference numeral 44 denotes a transfer opening of the wafer W, a reference numeral 45 denotes a heater configured to suppress condensation of the vapor of the hydrogen fluoride at the surface of the wafer W on the mounting table 41.

On a ceiling surface of the processing chamber 42, an end of a gas supply line 46 extended from the vaporizer 43 is connected to face the wafer W on the mounting table 41. The vapor of the hydrogen fluoride is supplied together with a carrier gas such as a nitrogen ($N_2$) gas through the gas supply line 46 to the wafer W. In FIG. 6, V and M denote a valve and a flow rate control unit, respectively.

On a bottom surface of the processing chamber 42, an exhaust opening 51 for exhausting an atmosphere within the processing chamber 42 is formed at, for example, multiple positions. An exhaust path 52 extended from the exhaust opening 51 is connected to a vacuum pump 54 via a pressure control unit 53 such as a butterfly valve.

Further, in the processing chamber 42, when the vapor of the hydrogen fluoride aqueous solution evaporated from the vaporizer 43 is supplied by the carrier gas to the wafer W on the mounting table 41, the natural oxide film 11 is dissolved as described above.

Figure 7:
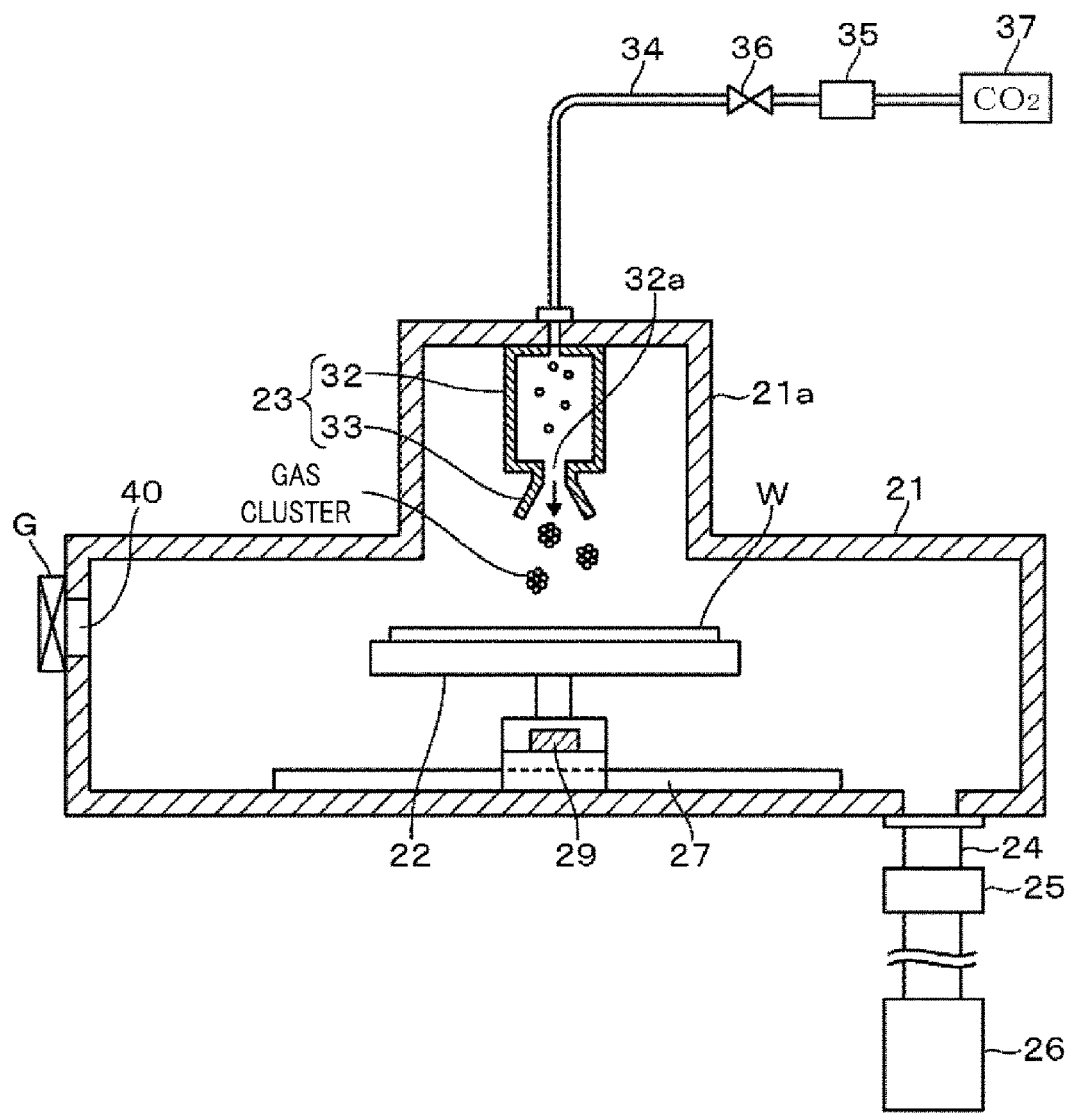
FIG. 7 is a longitudinal cross sectional view showing a device that irradiates a gas cluster to the target object in order to perform the cleaning method.

Hereinafter, the device that irradiates the gas cluster to the wafer W will be explained with reference to FIG. 7. As depicted in FIG. 7, this device includes a cleaning chamber 21 configured to accommodate the wafer W therein and remove the deposit 10. Further, within the cleaning chamber 21, there is provided a mounting table 22 configured to mount the wafer W thereon. At a central portion on a ceiling surface of the cleaning chamber 21, there is formed a protrusion portion 21a that is upwardly protruded in a cylindrical shape. At the protrusion portion 21a, the above-described nozzle 23 is provided as a gas cluster generating device. The nozzle 23 faces downwardly in a vertical direction in the present example embodiment. In FIG. 7, a reference numeral 40 denotes a transfer opening and G denotes a gate valve configured to open and close the transfer opening 40.

By way of example, at a position close to the transfer opening 40 on a bottom surface of the cleaning chamber 21, although illustration is omitted herein, a supporting pin is provided to pass through a through hole formed in the mounting table 22. Further, the wafer W is elevated with respect to the mounting table 22 by a combination of a non-illustrated elevating device provided at the mounting table 22 and the supporting pin, and the wafer W is transferred to a non-illustrated wafer transfer arm outside the cleaning chamber 21. On the bottom surface of the cleaning chamber 21, one end of an exhaust path 24 for vacuum-exhausting an atmosphere within the cleaning chamber 21 is connected. The other end of the exhaust path 24 is connected to a vacuum pump 26 via a pressure control unit 25 such as a butterfly valve.

The mounting table 22 is configured to be movable in a horizontal direction within the cleaning process 21 in order for the nozzle 23 to relatively scan throughout the entire surface of the wafer W on the mounting table 22. To be specific, under the mounting table 22 on the bottom surface of the cleaning chamber 21, an X-axis rail 27 extended horizontally along an X-axis direction and an Y-axis rail 29 configured to be movable along the X-axis rail 27 are provided. Further, the mounting table 22 is supported on the Y-axis rail 29. Furthermore, the mounting table 22 includes a non-illustrated temperature control device configured to control a temperature of the wafer W on the mounting table 22.

An upper end of the pressure room 32 is connected to one end of the gas supply line 34 extended to pass through the ceiling surface of the cleaning chamber 21. The other end of the gas supply line 34 is connected to a gas source 37, in which carbon dioxide is stored, via a valve 36 and the flow rate control unit 35. The pressure room 32 includes a non-illustrated pressure gauge, and a flow rate of a gas to be supplied into the pressure room 32 is controlled by a control unit 67 to be described later via the pressure gauge. Further, an angle or a distance of the nozzle 23 with respect to the mounting table 22 may be controlled by a non-illustrated driving unit. If an angle or a distance of the nozzle 23 is controlled, it is possible to suppress the deposit 10 removed from the wafer W from being attached again to the wafer W. Moreover, it is possible to reduce damage to the pattern 7 and also possible to easily remove the deposit 10 attached to a bottom surface of the groove 5. As described below, when a gas cluster is irradiated during the pre-treatment, an angle or a distance of the nozzle 23 may also be controlled in the same manner.

Figure 8:
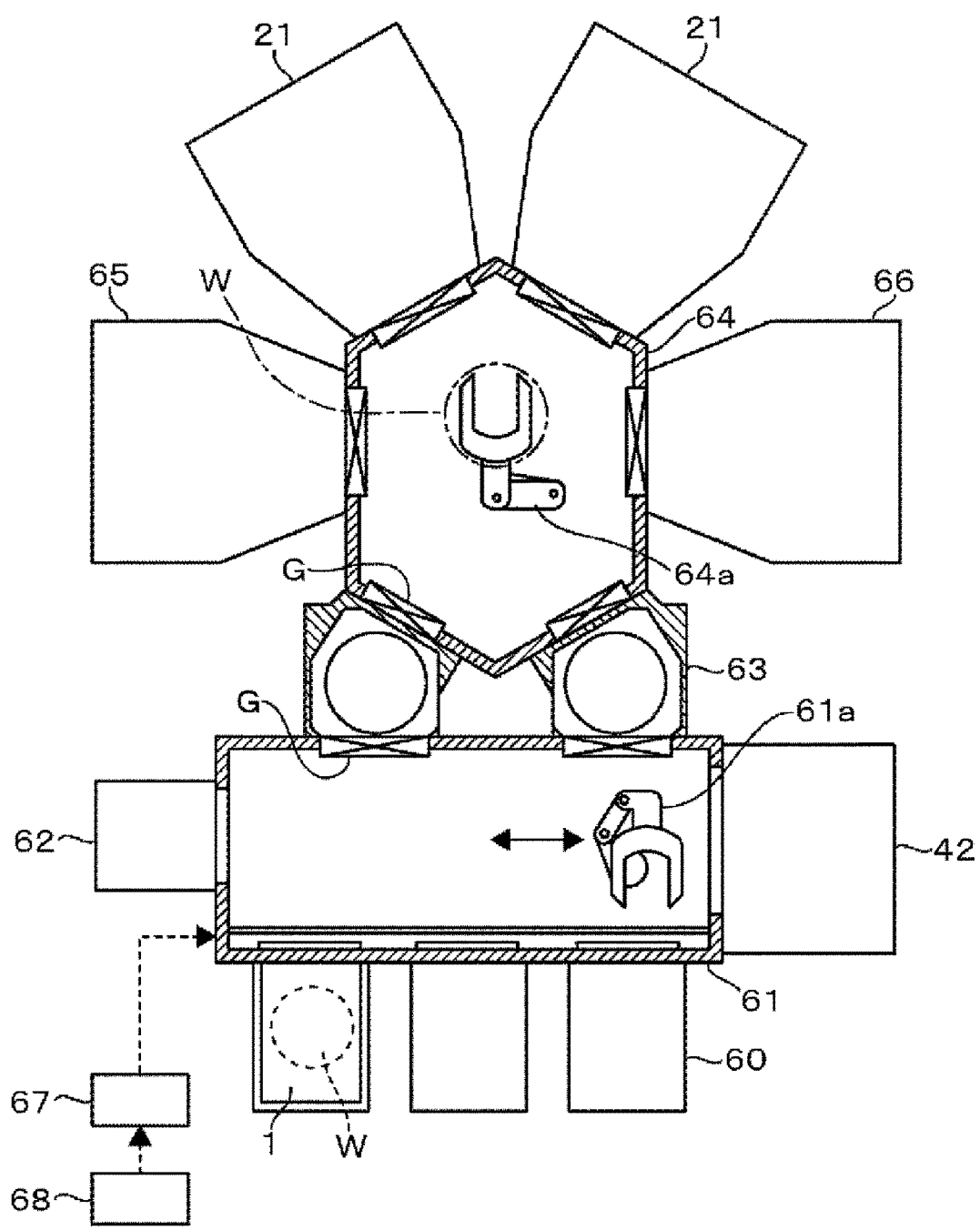
FIG. 8 is a plane view showing a processing apparatus that performs the cleaning method on the target object.

Hereinafter, the overall configuration of the processing apparatus including the processing chamber 42 and the cleaning chamber 21 will be explained with reference to FIG. 8. In the processing apparatus, a loading/unloading port 60 for mounting a FOUP 1 as an airtight transfer container that accommodates, for example, 25 sheets of the wafer W is arranged in parallel transversely at, for example, three positions. An atmospheric transfer chamber 61 is provided along the arrangement of the loading/unloading ports 60. Within the atmospheric transfer chamber 61, a wafer transfer device 61a including a multi-joint arm for transferring the wafer W is provided as a normal pressure transfer device. Further, at one side of the atmospheric transfer chamber 61, an alignment chamber 62 for adjusting a direction and a position of the wafer W is provided. At the other side of the atmospheric transfer chamber 61, the above-described processing chamber 42 is connected to face the alignment chamber 62. At the atmospheric transfer chamber 61's surface opposite to the loading/unloading ports 60, a load-lock chamber 63 configured to switch an atmosphere between a normal pressure atmosphere and an atmospheric atmosphere is connected airtightly. In the present example embodiment, the load-lock chamber 63 is arranged in parallel transversely at two positions.

At an inner side than the load-lock chambers 63 as viewed from the atmospheric transfer chamber 61, a vacuum transfer chamber 64 including a transfer arm 64a as a vacuum transfer device for transferring the wafer W in a vacuum atmosphere is connected airtightly. The vacuum transfer chamber 64 is connected airtightly to the above-described cleaning chamber 21. Further, the vacuum transfer chamber 64 is also connected airtightly to an etching chamber 65 in which a plasma etching process for forming the pattern 7 on the wafer W is performed and an ashing chamber 66 in which a plasma ashing process is performed onto the photoresist mask. Furthermore, the vacuum transfer chamber 64 may be connected airtightly a processing chamber in which, for example, a CVD (Chemical Vapor Deposition) process is performed after the deposit 10 is removed.

The processing apparatus further includes the control unit 67 including a computer configured to control overall operations of the devices. A memory of the control unit 67 stores a program configured to perform the above-described pre-treatment, cleaning process, etching process, and ashing process. The program includes a step group for performing an operation of the device corresponding to the process with respect to the wafer W. The program in a storage unit 68 as a storage medium such as a hard disk, a compact disk, a magneto-optical disk, a memory card, a flexible disk, and the like may be installed in the control unit 67.

In the processing apparatus, when the FOUP 1 is mounted on the loading/unloading port 60, the wafer W is unloaded from the FOUP 1 by the wafer transfer device 61a. On the surface of the wafer W, for example, a photoresist mask corresponding to the above-described pattern 7 is formed. Then, after the wafer W is aligned in the alignment chamber 62, the wafer W is loaded into the load-lock chamber 63 set to be in the atmospheric atmosphere. After an atmosphere within the load-lock chamber 63 is evacuated to a vacuum atmosphere, the wafer W is transferred to the etching chamber 65 and the ashing chamber 66 in sequence by the transfer arm 64a. Then, the above-described pattern 7 is formed and the ashing process is carried out in sequence. Thereafter, the wafer W is transferred into the processing chamber 42 via the load-lock chamber 63 and the atmospheric transfer chamber 61, and the above-described pre-treatment is carried out. Then, the wafer W is loaded into the cleaning chamber 21, and a gas cluster is irradiated. Thereafter, the processed wafer W is returned back to the FOUP 1 through the load-lock chamber 63 and the atmospheric transfer chamber 61.

According to the above-described example embodiment, when the deposit 10 attached to the surface of the wafer W is removed, the vapor of the hydrogen fluoride is supplied to the wafer W in the pre-treatment to dissolve the natural oxide film 11 on the surface of the wafer W. For this reason, the deposit 10 becomes in slight contact with the surface of the wafer W and has a very weakened adhesive strength with respect to the surface. Therefore, by irradiating the gas cluster composed of a carbon dioxide gas to the deposit 10, the deposit 10 can be easily removed. Accordingly, when removing the deposit 10, even if the fine pattern 7 is formed on the wafer W as described above, it is possible to suppress occurrence of damage such as destruction of the line 6 by controlling, for example, an irradiation speed of the gas cluster.

In this case, the carbon dioxide gas does not react with the underlying film 12 of the wafer W. Further, the gas cluster is irradiated to the wafer W while being not ionized. For this reason, when the gas cluster is irradiated to the wafer W, occurrence of damage, in which the surface of the wafer W is roughened or physically cut off, can be suppressed. Further, since the gas cluster is not ionized, for example, it is not required to provide a device that ionizes a gas or a gas cluster in the above-described cleaning chamber 21. Therefore, it is possible to suppress a cost of the device.

Further, since the wafer W is exposed to an atmosphere of the vapor of the hydrogen fluoride within the processing chamber 42, adhesive strength of the deposit 10 with respect to the entire surface of the wafer W is reduced at a time through the pre-treatment. For this reason, as compared with a conventional case where the deposit 10 is removed by using only a gas cluster of the reactive gas, it is possible to uniformly perform the process throughout the entire surface in a short time, and also possible to increase throughput. Furthermore, by combining the pre-treatment and the irradiation of the gas cluster, it is possible to suppress an amount of the gas or chemical liquid used as compared with a case where the deposit 10 is removed by using only a gas or a gas cluster, or by using only a chemical liquid. In this case, in all of the processes including the pre-treatment and the irradiation of the gas cluster, a chemical liquid is not supplied to the wafer W, it is possible to suppress a cost required to waste the liquid.

By performing the above-described pre-treatment, the surface of the wafer W is changed from the natural oxide film 11 that does not have conductivity to the underlying film 12 that has conductivity, so that the surface of the wafer W has conductivity. For this reason, even if the deposit 10 is attracted to the natural oxide film 11 by the above-described physical adhesive force together with, for example, an electrostatic force, the electrostatic force may be lost or weakened by the pre-treatment, and, thus, the deposit 10 can be easily removed from the wafer W. Further, even if the natural oxide film 11 and the deposit 10 are chemically bonded to each other, since the bonded natural oxide film 11 is etched, the deposit 10 can be easily removed as described above.

Modification Example of First Example Embodiment: Oxidation of Silicon Substrate Hereinafter, a modification example of the first example embodiment will be explained with reference to FIG. 9. In the first example embodiment as described above, there has been explained a case where the natural oxide film 11 on the surface of the wafer W is removed. However, it is difficult to control a film thickness of the natural oxide film 11, and, thus, if controllability or reproducibility is needed in a cleaning process, a pre-treatment is performed as follows.

Figure 9:
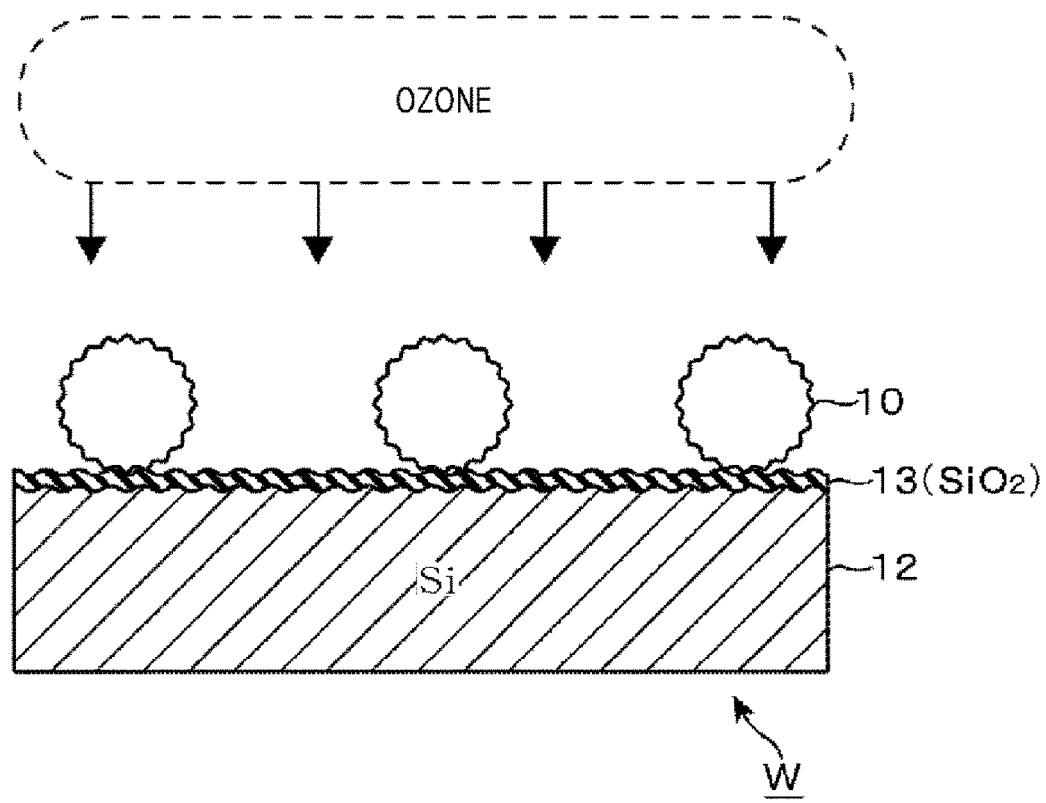
FIG. 9 is a schematic diagram showing an operation of a cleaning method in accordance with a modification example of the first example embodiment.

If controllability or reproducibility is needed in a cleaning process, a surface layer of the underlying film 12 is oxidized first. To be specific, as depicted in FIG. 9, an oxidizing gas such as an ozone gas is supplied to the surface of the wafer W. By this ozone gas, the surface layer of the underlying film 12 in contact with the deposit 10 is slightly oxidized by, for example, about 1 nm to form an oxide film 13 as a modification layer. Then, a supply of the vapor of the hydrogen fluoride and irradiation of the gas cluster composed of a carbon dioxide gas are carried out in this sequence, and the deposit 10 is removed throughout the entire surface together with the oxide film 13. In the modification example, the pre-treatment is carried out by supplying the vapor of the hydrogen fluoride and performing oxidation process of the underlying film 12 with the ozone gas. As a device that supplies the ozone gas to the wafer W, a device including an ozone gas supply source (not illustrated) instead of the vaporizer 43 shown in FIG. 6 is used.

Herein, in order to oxidize the underlying film 12 of the wafer W, the ozone gas is supplied to the wafer W. However, instead of the ozone gas, ozone water (an aqueous solution containing an ozone gas) may be supplied. An example of a pre-treatment module that supplies ozone water to the wafer W will be explained briefly with reference to FIG. 10. Since an operation of oxidizing the underlying film 12 with ozone water, or a subsequent etching process for the oxide film 13 or irradiation of a gas cluster is the same as the above-described example embodiment, explanation thereof will be omitted.

Figure 10:
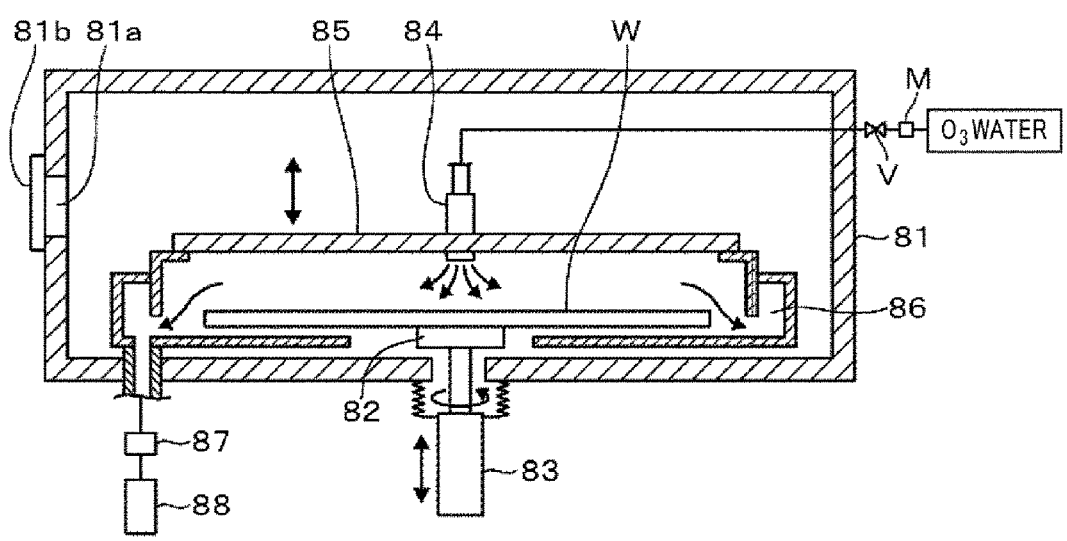
FIG. 10 is a longitudinal cross sectional view showing a device that performs a pre-treatment in accordance with the modification example.

This device includes a processing chamber 81 configured to supply ozone water to the wafer W and a spin chuck 82 serving as a mounting table configured to mount the wafer W thereon. The spin chuck 82 supports a central portion of a lower surface of the wafer W, and is configured to be rotatable around a vertical axis and vertically movable by a driving unit 83. Above the spin chuck 82, an ozone water nozzle 84 for discharging ozone water to the wafer W is provided as a pre-treatment device. At an upper portion of the spin chuck 82, a cover body 85 configured to airtightly seal an atmosphere, in which a pre-treatment is performed on the wafer W, is provided to be vertically movable by a non-illustrated elevating device. The ozone water nozzle 84 is provided at a central portion of the cover body 85. At a side of the spin chuck 82, a ring-shaped exhaust path 86 is provided in the vicinity of a periphery of the wafer W in a circumference direction thereof. A lower surface of the exhaust path 86 is connected to a vacuum pump 88 via a pressure control device 87 such as a butterfly valve or the like. In FIG. 10, a reference numeral 81*a* denotes a transfer opening of the wafer W and a reference numeral 81*b* denotes a shutter for opening and closing the transfer opening 81*a*.

In the processing chamber 81, when ozone water is discharged from the ozone water nozzle 84 toward a central portion of the wafer W attracted and held by the spin chuck 82 and rotated around the vertical axis, the ozone water is diffused toward the periphery of the wafer W by a centrifugal force and forms a liquid film throughout the entire surface of the wafer W. Then, when the oxidation process is finished, the spin chuck 82 is rotated at a high speed to push the ozone water toward an outer periphery of the wafer W. Thereafter, the surface of the wafer W is cleaned with a rinse liquid discharged from a non-illustrated rinse nozzle.

In the first example embodiment and the modification example of the first example embodiment, there has been explained a case where the pattern 7 is formed on the wafer W. However, it is possible to easily remove the deposit 10 from even a silicon oxide film or a silicon film, on which the pattern 7 is not formed, by performing the pre-treatment and irradiating the gas cluster composed of a carbon dioxide gas in the same manner. That is, a source gas used for forming the film by, for example, a CVD method, contains an organic material. Accordingly, if this organic material is attached as the deposit 10 to the surface of the wafer W, it is removed in the same manner as explained above.

Figure 11:
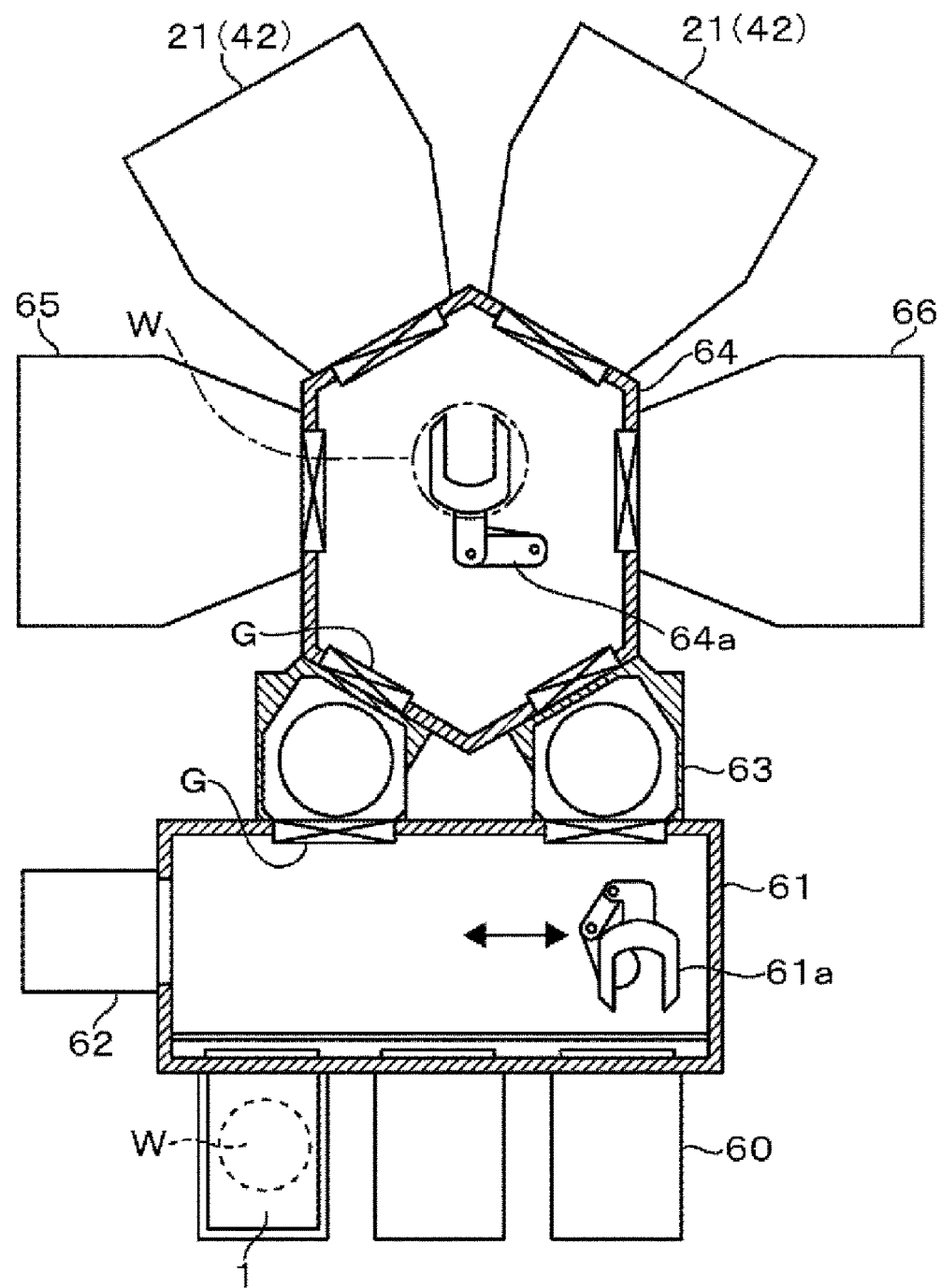
FIG. 11 is a plane view showing a processing apparatus in accordance with the modification example.
Figure 12:
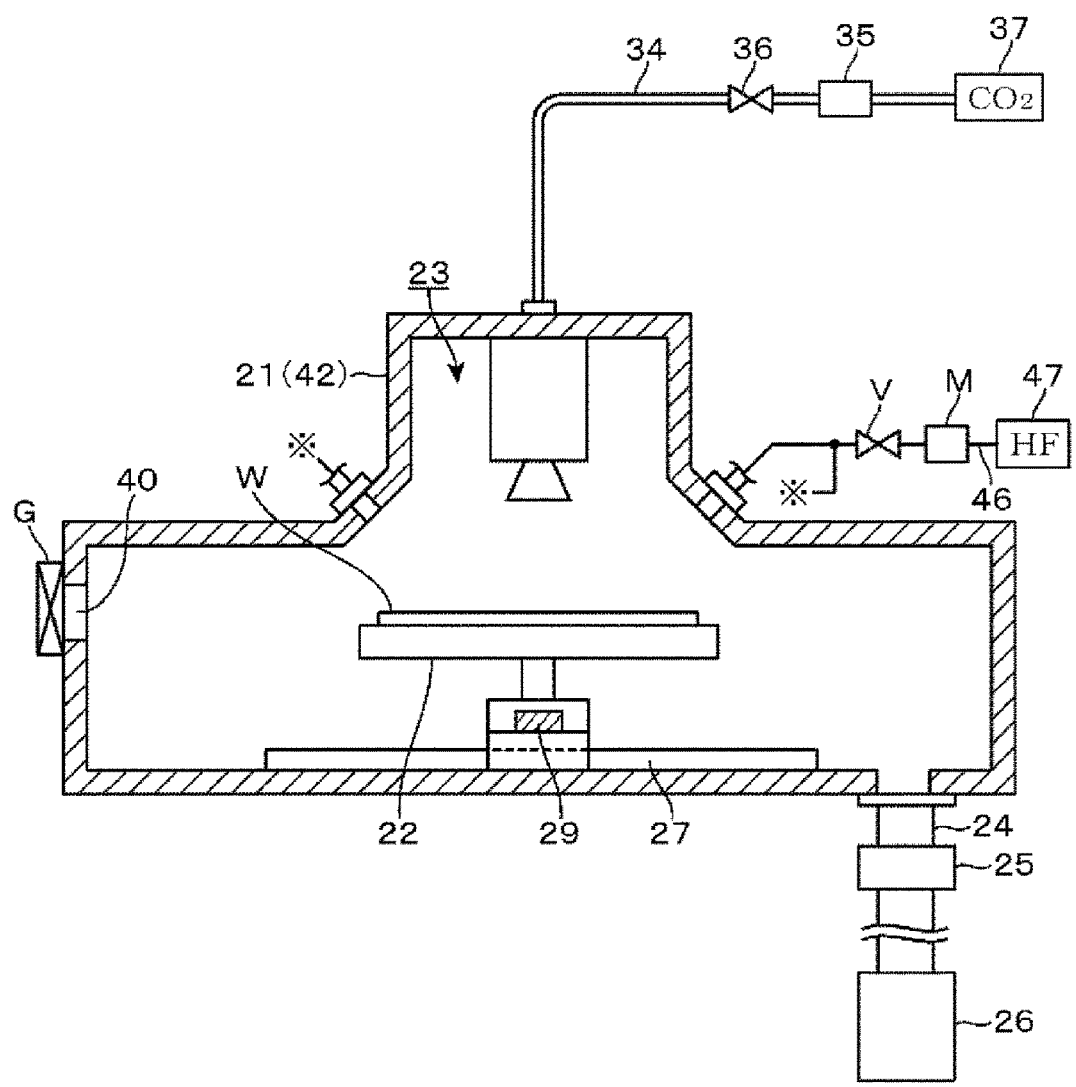
FIG. 12 is a longitudinal cross sectional view showing a device that performs a pre-treatment in accordance with the modification example.

Further, although the pre-treatment is carried out in an atmospheric atmosphere in the above-described examples, the pre-treatment may be carried out in a vacuum atmosphere. In this case, the processing chamber 42 for performing the pre-treatment and the cleaning chamber 21 for performing a cleaning process may be separately connected to the vacuum transfer chamber 64 shown in FIG. 8, or the processing chamber 42 and the cleaning chamber 21 may be provided as a common single chamber. To be specific, as depicted in FIG. 11 and FIG. 12, the vacuum transfer chamber 64 is airtightly connected to the cleaning chamber 21 also serving as the processing chamber 42. In the cleaning chamber 21, the nozzle 23 and a gas source 47 for storing a hydrogen fluoride gas are provided. In the modification example, at a ceiling surface of the cleaning chamber 21 at a side outer than an outer periphery of the protrusion portion 21*a*, the gas supply line 46 extended from the gas source 47 is connected to multiple portions, and an opening end of each gas supply line 46 is provided to face the central portion of the wafer W on the mounting table 22.

In the device depicted in FIG. 12, for example, a pressure within the cleaning chamber 21 is set to be a process pressure for performing a pre-treatment, and the pre-treatment is performed onto the wafer W. Then, after the pressure within the cleaning chamber 21 is set to be lower (high vacuum) than the process pressure, the above-described cleaning process is performed.

Second Example Embodiment: Germanium Film

Figure 13:
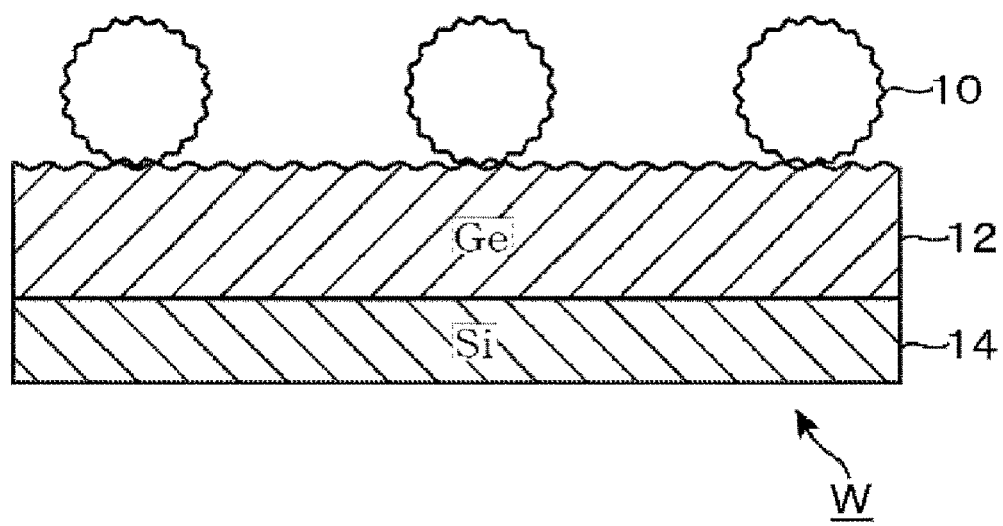
FIG. 13 is a schematic diagram showing a target object to which a cleaning method in accordance with a second example embodiment is applied.

Hereinafter, a second example embodiment will be explained with reference to FIG. 13 to FIG. 16. In the second example embodiment, the underlying layer 12 formed of a germanium (Ge) film is formed on a silicon layer 14 of the wafer W as depicted in FIG. 13. Further, the deposit 10 is attached to a surface of the underlying film 12. In this case, the deposit 10 contains a by-product generated when the underlying film 12 is formed by, for example, a CVD method or the like. In the second example embodiment, a pre-treatment is performed as follows.

Figure 14:
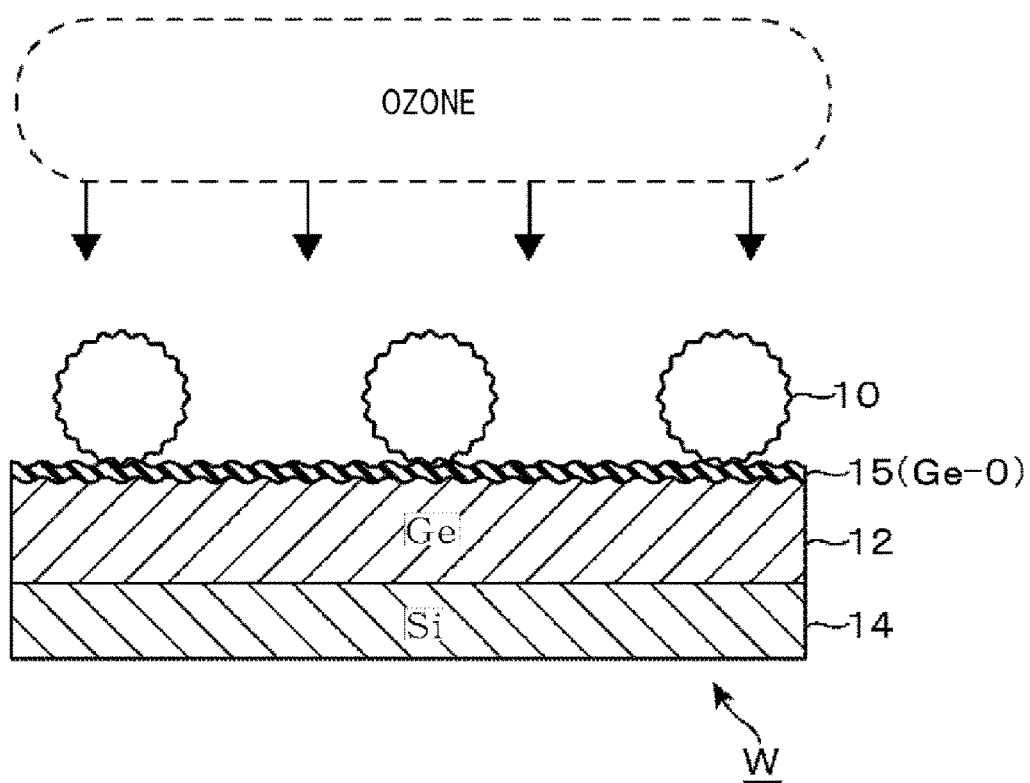
FIG. 14 is a schematic diagram showing an operation of the cleaning method in accordance with the second example embodiment.
Figure 15:
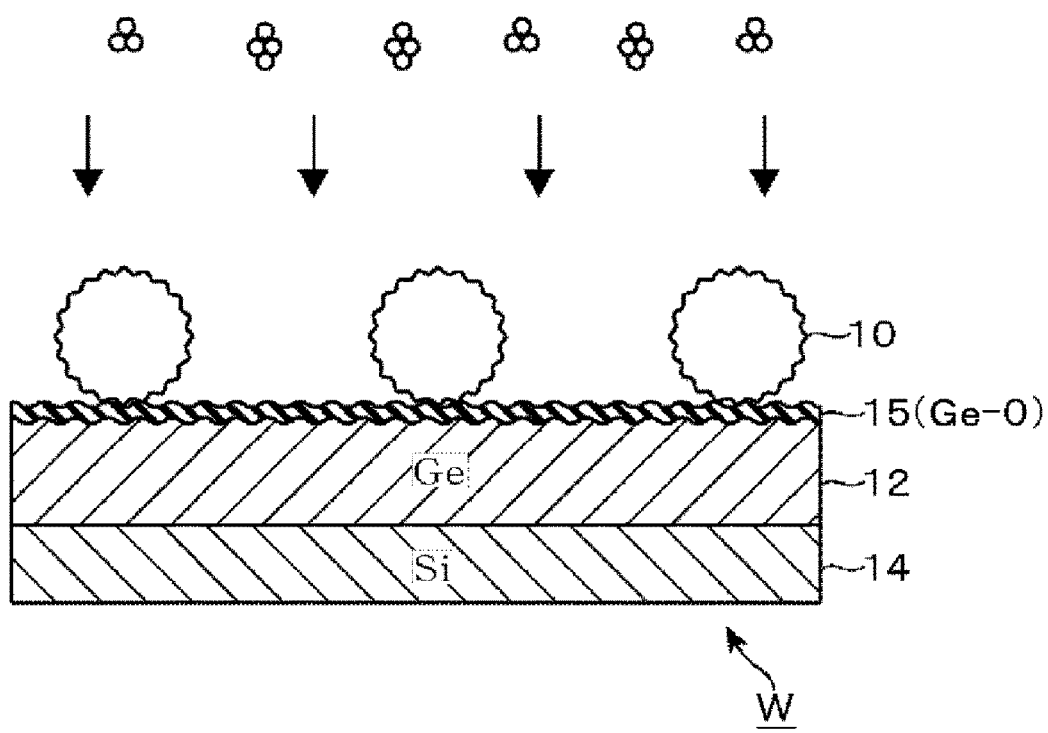
FIG. 15 is a schematic diagram showing an operation of the cleaning method in accordance with the second example embodiment.
Figure 16:
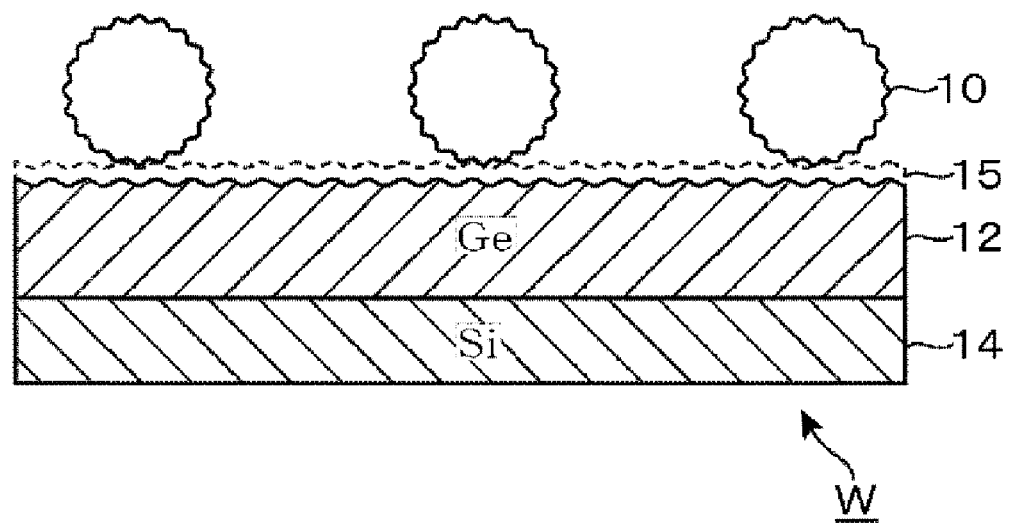
FIG. 16 is a schematic diagram showing an operation of the cleaning method in accordance with the second example embodiment.

To be specific, an ozone gas is supplied to the surface of the underlying film 12. By this ozone gas, a surface layer of the underlying film 12 is slightly oxidized to form a germanium oxide film (Ge—O) film 15 as a modification layer as depicted in FIG. 14. Then, as depicted in FIG. 15, when a gas cluster composed of, for example, water vapor ($H_2O$) is irradiated to the wafer W, the germanium oxide film 15 is dissolved and etched by the water vapor. For this reason, through the oxidation process of the underlying film 12 with the ozone gas and the pre-treatment by supplying a gas cluster of the water vapor, the deposit 10 becomes in slight contact with the surface of the wafer W as depicted in FIG. 16 and an adhesive strength becomes very weakened. In this case, the gas cluster composed of the water vapor does not react with the germanium film as the underlying film 12. For this reason, while suppressing the damage to the underlying film 12 by the gas cluster composed of the water vapor, the germanium oxide film 15 is selectively etched.

Then, a gas cluster composed of a carbon dioxide gas is irradiated to the wafer W. Since the gas cluster of the carbon dioxide gas does not react with the germanium film as the underlying film 12, the deposit 10 only or together with the germanium oxide film 15 dissolved by the water vapor is removed while the underlying film 12 is not damaged.

In the second example embodiment, a device for oxidizing the underlying film 12 has the same configuration as the device depicted in FIG. 6 except that instead of the vaporizer 43, an ozone gas source is connected. Further, in a device for irradiating the gas cluster composed of the water vapor, a pre-treatment chamber having the same configuration as the above-described cleaning chamber 21 is airtightly connected to the vacuum transfer chamber 64, and a vaporizer, as the gas source 37, for vaporizing pure water is provided. In the second example embodiment, the gas supply line 46 for supplying an ozone gas to the wafer W and the nozzle for irradiating the gas cluster composed of the water vapor constitute a pre-treatment device. Further, when the underlying film 12 is oxidized, the above-described device depicted in FIG. 10 may be used to supply ozone water, instead of an ozone gas, to the wafer W.

Figure 17:
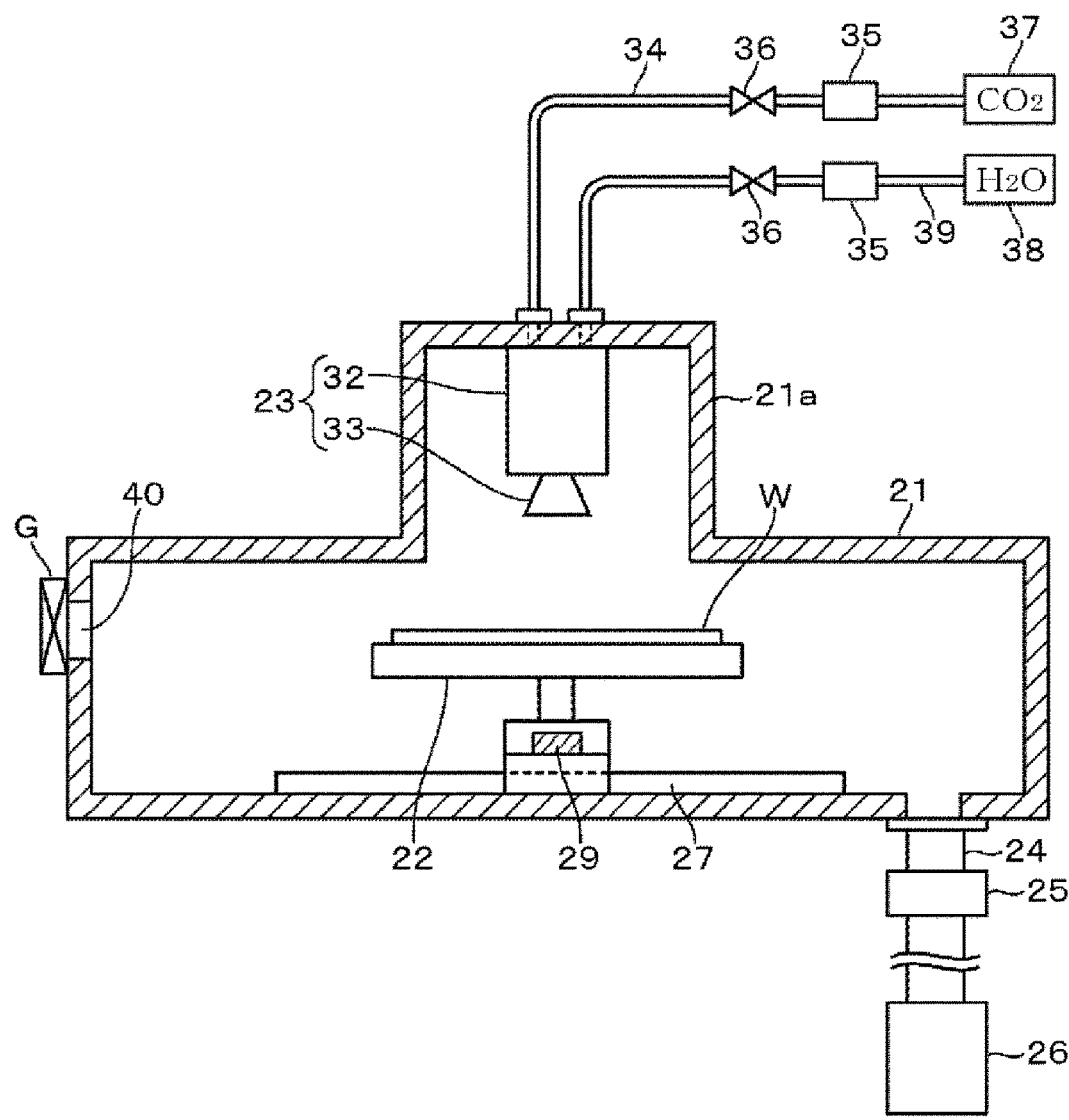
FIG. 17 is a longitudinal cross sectional view showing a device that irradiates a gas cluster and performs a pre-treatment in accordance with the second example embodiment.

In this case, if the gas cluster composed of an ozone gas is used, the device may have the following configuration. That is, as depicted in FIG. 17, together with the gas supply line 34 for irradiating a gas cluster composed of a carbon dioxide gas or the gas source 37, a vaporizer 38 for vaporizing pure water and a water vapor supply line 39 extended from the vaporizer 38 may be connected to the nozzle 23. Therefore, in the second example embodiment, a device for generating a gas cluster in a pre-treatment is the same as a device for generating a gas cluster in a cleaning process. In this case, as explained above, after the underlying film 12 is oxidized, a supply of the gas cluster composed of the water vapor and a supply of the gas cluster composed of the carbon dioxide gas may be carried out in this sequence. Further, as can be seen from an experimental example to be described below, these gas clusters may be simultaneously supplied to the wafer W to perform an etching process onto the germanium oxide film 15 and remove the deposit 10 at the same time. When the germanium oxide film 15 is etched, water vapor in the gas phase or pure water in the liquid phase may be supplied to the wafer W instead of supplying the gas cluster composed of the water vapor. In this case, in the devices depicted in FIG. 6 and FIG. 10, pure water is used instead of the hydrogen fluoride aqueous solution or the ozone water.

Third Example Embodiment: Photoresist Mask

Figure 18:
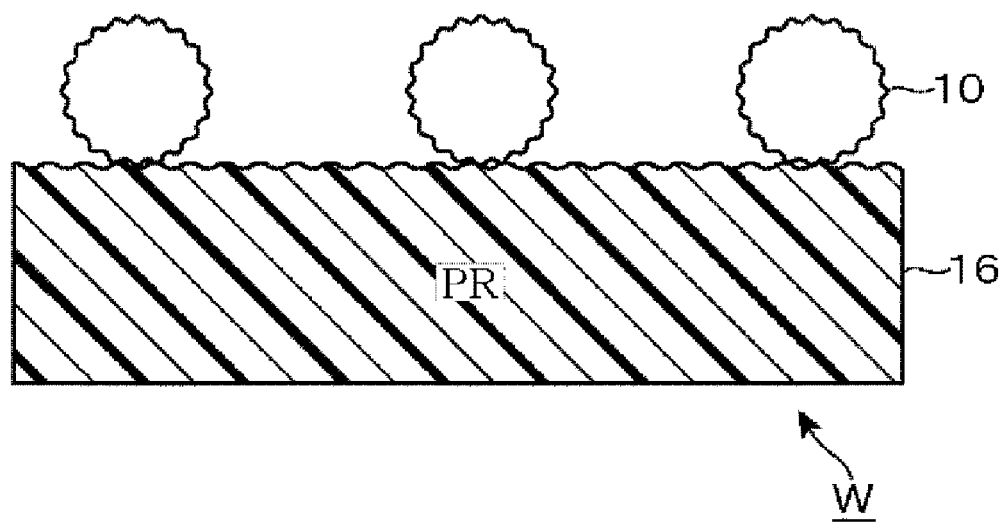
FIG. 18 is a schematic diagram showing a target object to which a cleaning method in accordance with a third example embodiment is applied.
Figure 19:
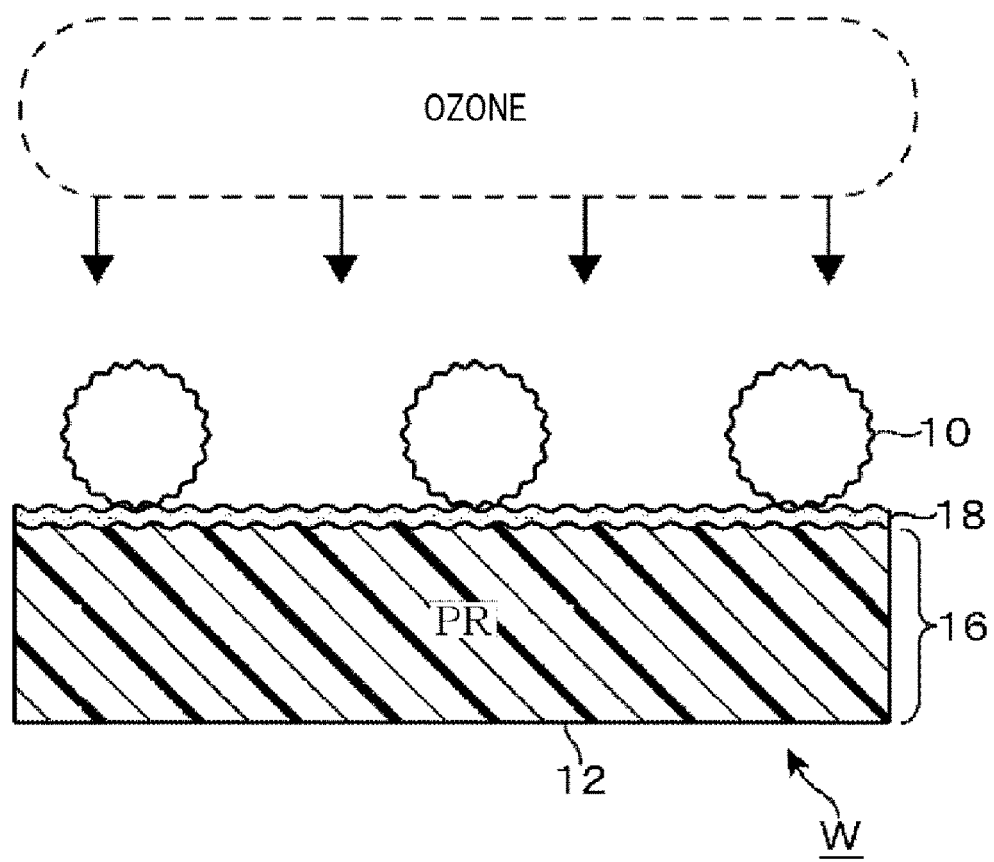
FIG. 19 is a schematic diagram showing an operation of the cleaning method in accordance with the third example embodiment.

Hereinafter, a third example embodiment will be explained with reference to FIG. 18 and FIG. 19. In the third example embodiment, as depicted in FIG. 18, there will be explained a case where the deposit 10 attached to a photoresist mask 16 for forming the pattern 7 on the wafer W is removed. That is, after the photoresist mask 16 is patterned by performing an exposure process and a developing process, an organic material removed from the photoresist mask 16 by the patterning is attached, as the deposit 10, to a surface of the photoresist mask 16. For this reason, the deposit 10 is removed as follows.

To be specific, by using the device depicted in FIG. 6, instead of vapor of hydrogen fluoride, an ozone gas is supplied to the surface of the wafer W in a pre-treatment. Through the pre-treatment, as depicted in FIG. 19, a surface of the photoresist mask 16 is slightly oxidized and etched, and the deposit 10 has a very weakened adhesive strength with respect to the photoresist mask 16. For this reason, when a gas cluster composed of a carbon dioxide gas is irradiated to the wafer W, since the gas cluster does not react with the photoresist mask 16 as the underlying film 12 under the surface thereof, a modification layer 18 together with the deposit 10 is removed.

In the third example embodiment, instead of the ozone gas, ozone water may be supplied to the wafer W. Further, in the pre-treatment, a gas cluster may be generated by using the ozone gas and the surface of the photoresist mask 16 may be oxidized by the gas cluster. In this case, the gas cluster composed of the ozone gas and the gas cluster composed of the carbon dioxide gas may be simultaneously supplied to the wafer W to perform the pre-treatment and remove the deposit 10 at the same time.

Figure 20:
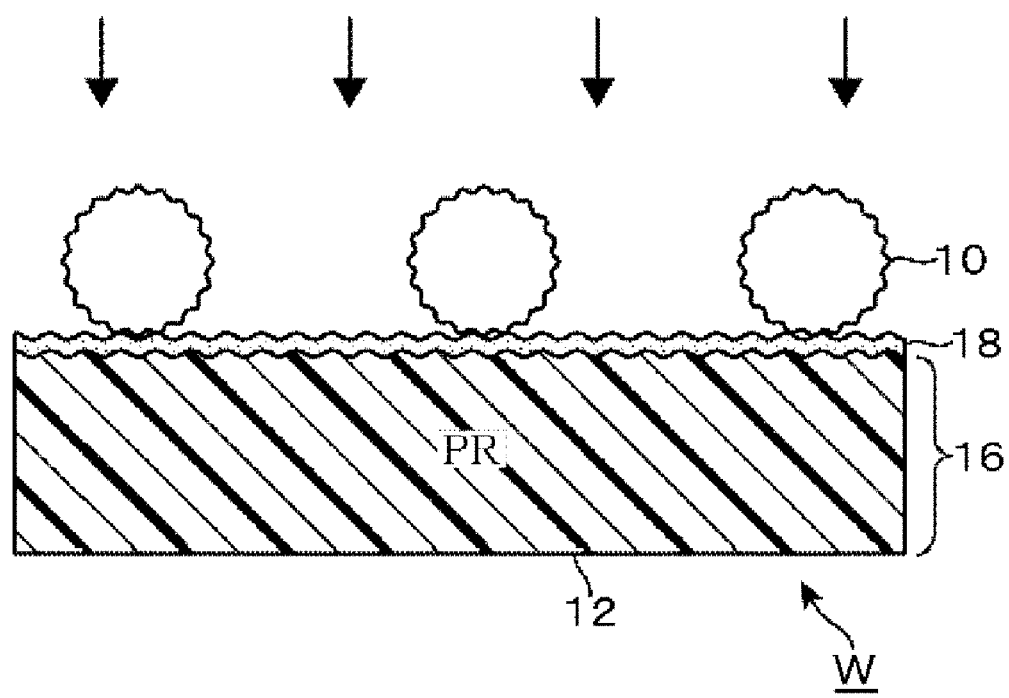
FIG. 20 is a schematic diagram showing an operation of the cleaning method in accordance with the third example embodiment.

Further, if the deposit 10 on the photoresist mask 16 is removed, in a pre-treatment, ultraviolet (UV) rays may be irradiated as depicted in FIG. 20 instead of supplying the ozone gas. That is, since the UV rays are irradiated, the surface of the photoresist mask 16 is hardened by degradation, so that it is easily removable. For this reason, when the gas cluster composed of the carbon dioxide gas is irradiated to the photoresist mask 16, a hardened layer on the surface of the photoresist mask 16 is removed together with the deposit 10 in the same manner. Therefore, in the third example embodiment, the process of irradiating the gas cluster composed of the carbon dioxide gas serves as a part of the pre-treatment (etching the surface of the photoresist mask 16). Alternatively, in the pre-treatment, a supply of the ozone gas and irradiation of the UV rays may be carried out at the same time. In this case, in the same manner as described above, an adhesive strength of the deposit 10 becomes very weakened through the etching of the surface thereof. As a result, when the gas cluster composed of the carbon dioxide gas is irradiated to the wafer W, the deposit 10 is easily removed.

Figure 21:
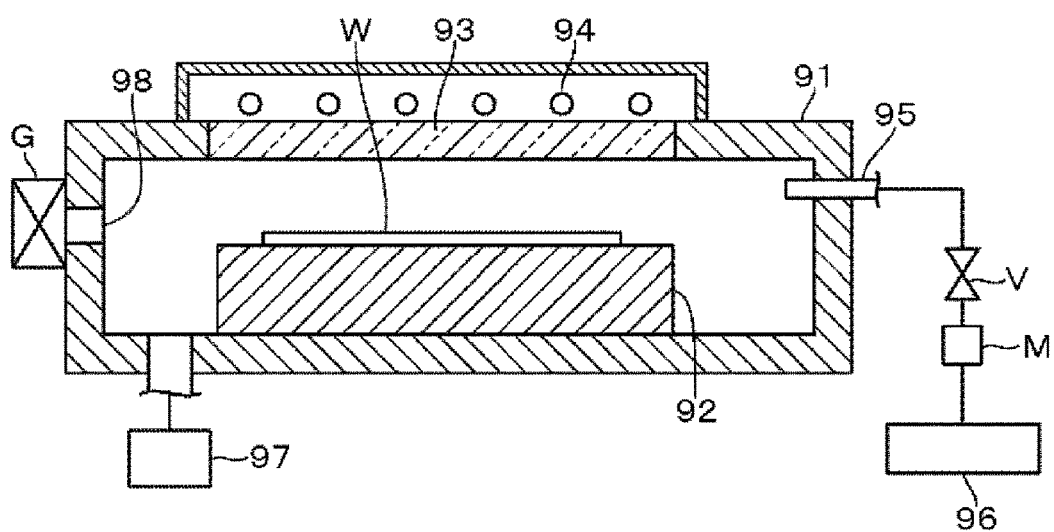
FIG. 21 is a longitudinal cross sectional view showing a device that performs a pre-treatment in accordance with the third example embodiment.

A device that irradiates ultraviolet rays to the wafer W will be explained briefly with reference to FIG. 21. This device includes a processing chamber 91 and a mounting table 92 provided within the processing chamber 91. At a portion of a ceiling surface of the processing chamber 91 facing the mounting table 92, a transparent window 93 made of, for example, quartz or the like is airtightly provided. Above the transparent window 93, a UV lamp 94 for irradiating ultraviolet rays to the wafer W on the mounting table 92 via the transparent window 93 is provided as a pre-treatment device. In FIG. 21, a reference numeral 95 denotes a gas supply line, a reference numeral 96 denotes a gas source that stores, for example, a nitrogen gas, a reference numeral 97 denotes a vacuum pump, and a reference numeral 98 denotes a transfer opening. The processing chamber 91 is airtightly connected to, for example, the above-described vacuum transfer chamber 64. The processing chamber 91 where ultraviolet rays are irradiated to the wafer W and the processing chamber 42 where an ozone gas is supplied to the wafer W as depicted in FIG. 6 may be provided as a common single chamber to supply an ozone gas and irradiate ultraviolet rays to the wafer W at the same time.

Fourth Example Embodiment: Metal Film

Figure 22:
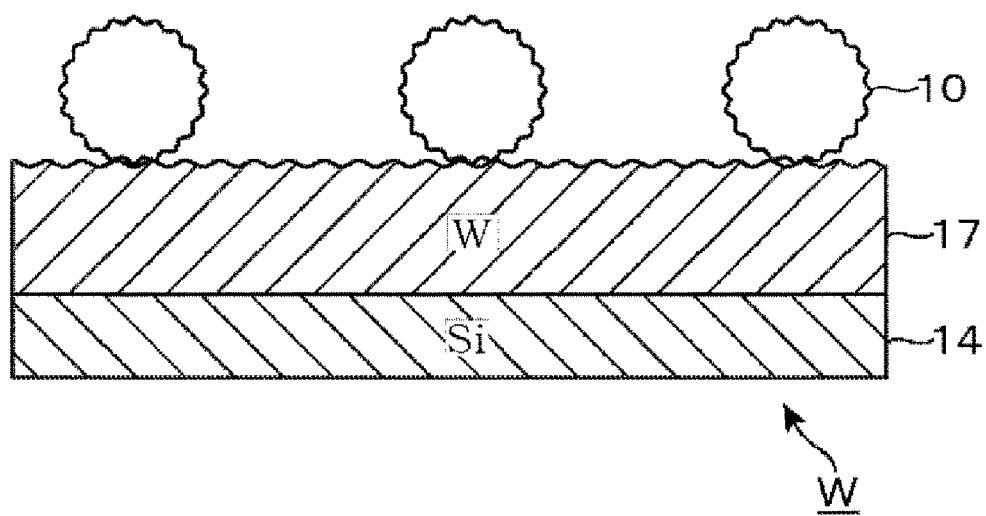
FIG. 22 is a schematic diagram showing a target object to which a cleaning method in accordance with a fourth example embodiment is applied.

Hereinafter, a fourth example embodiment will be explained with reference to FIG. 22 and FIG. 23. In the fourth example embodiment, there will be explained a case where the deposit 10 on a metal film 17, which is formed on the silicon layer 14 of the wafer W or buried in the grooves 5, is removed. In the fourth example embodiment, the metal film 17 is made of, for example, tungsten (W). That is, a source gas used for forming the metal film 17 by a CVD method contains an organic material as described above, and, thus, as depicted in FIG. 22, a residue formed of the organic material may be attached, as the deposit 10, to a surface of the metal film 17. Therefore, the deposit 10 is removed as follows.

Figure 23:
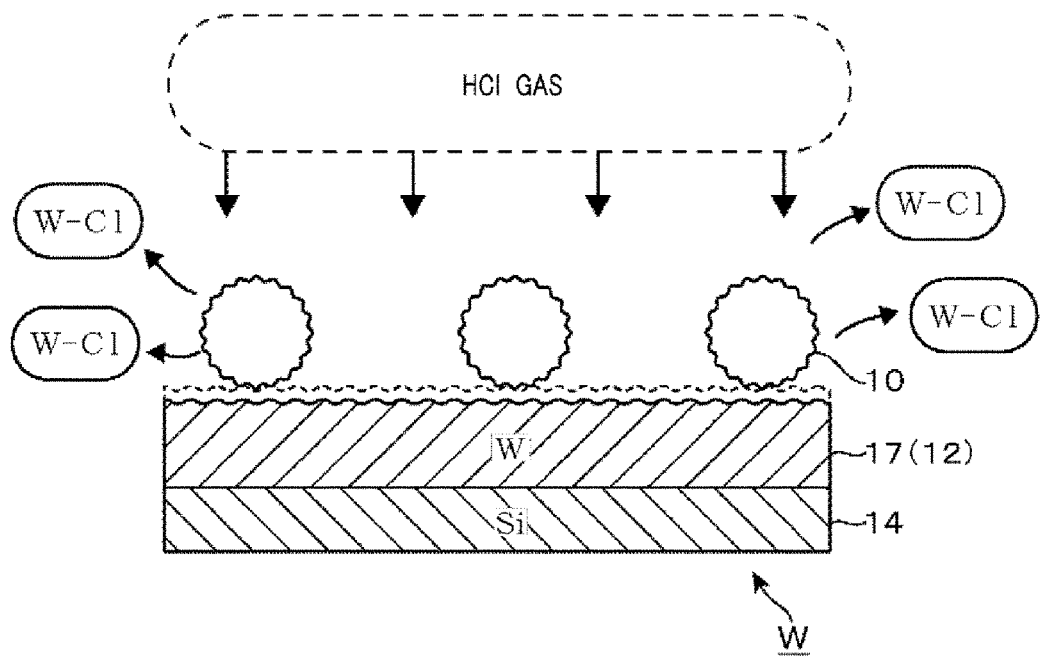
FIG. 23 is a schematic diagram showing an operation of the cleaning method in accordance with the fourth example embodiment.

To be specific, as depicted in FIG. 23, by using the device depicted in FIG. 6, a hydrogen chloride (HCl) gas is supplied to the wafer W in a pre-treatment. By this hydrogen chloride gas, a surface layer of the metal film 17 is slightly etched and removed. For this reason, an adhesive strength of the deposit 10 with respect to the metal film 17 becomes very weakened. Therefore, when a gas cluster composed of a carbon dioxide gas that does not react with respect to the metal film 17 serving as the underlying film 12 is irradiated to the wafer W, the deposit 10 is easily removed.

In this case, a gas used for the pre-treatment may be a chlorine trifluoride ($ClF_3$) gas instead of the hydrogen chloride gas. Further, as the metal film 17, a titanium film may be used instead of the tungsten film.

Fifth Example Embodiment: Etching of By-Product

Hereinafter, a fifth example embodiment will be explained. In each of the above-described example embodiments, there has been explained a case where a surface of the wafer W is etched in a pre-treatment. However, in the fifth example embodiment, instead of the surface of the wafer W, a surface of the deposit 10 is etched. That is, if a material of the deposit 10 is already known, or if a material contained in the deposit 10 is expected, when the material thereof is etched, for example, a lower end portion of the deposit 10 is retreated in an upward direction as viewed from the wafer W. Therefore, in this case, the deposit 10 becomes easily separated from the wafer W, and, thus, the deposit 10 is easily removed by a gas cluster composed of a carbon dioxide gas in the same manner.

Figure 24:
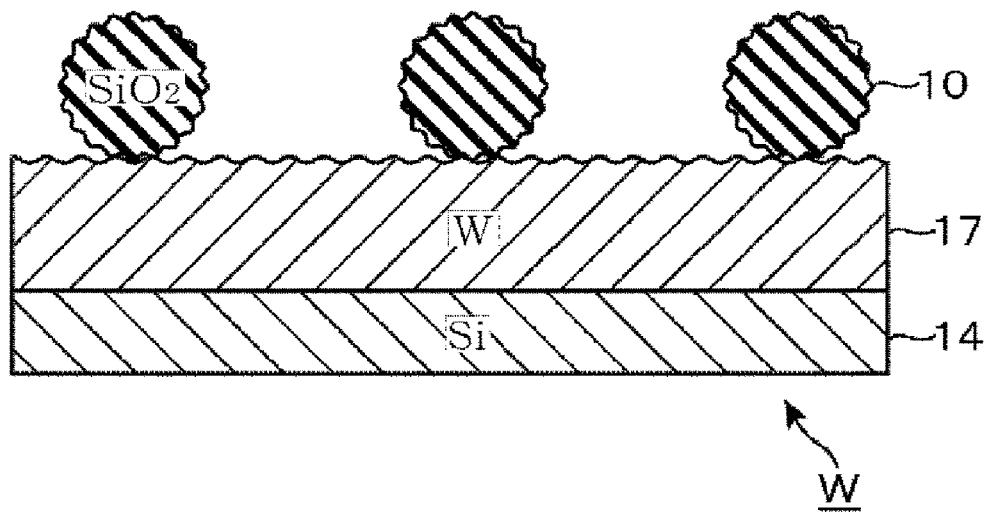
FIG. 24 is a schematic diagram showing a target object to which a cleaning method in accordance with a fifth example embodiment is applied.
Figure 25:
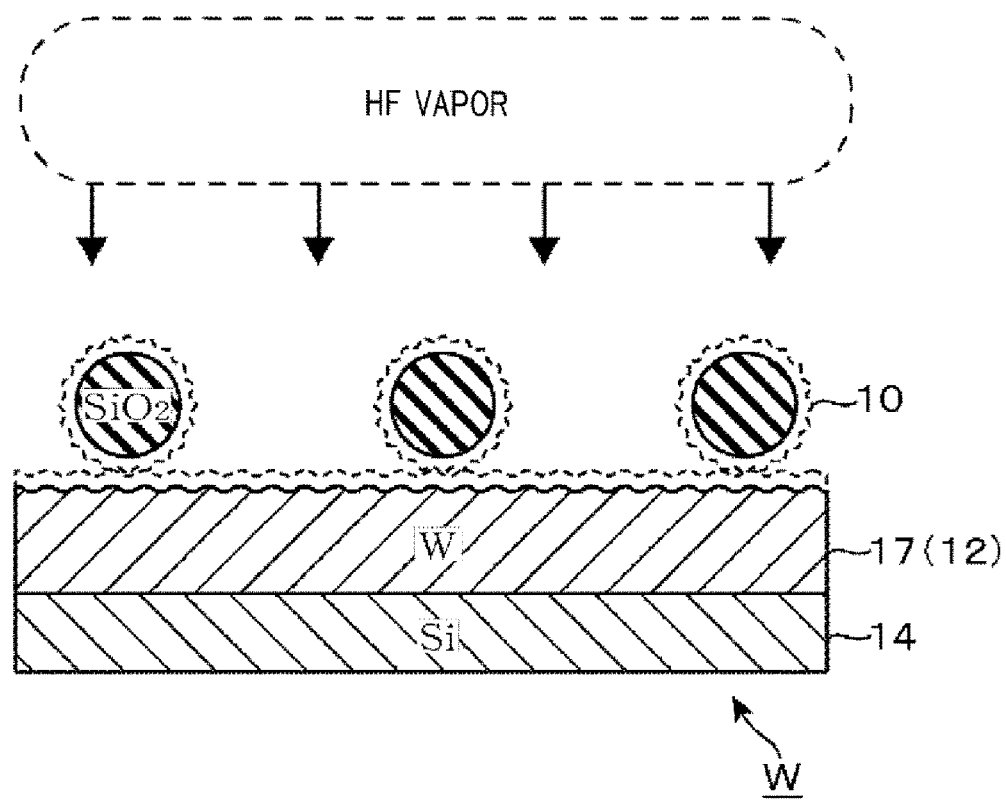
FIG. 25 is a schematic diagram showing an operation of the cleaning method in accordance with the fifth example embodiment.

In FIG. 24, the deposit 10 is made of silicon oxide, and the deposit 10 is attached to, for example, the metal film 17 as a surface of the wafer W. In this case, as depicted in FIG. 25, vapor of hydrogen fluoride is supplied to the wafer W and a surface of the deposit 10 is etched. Therefore, the deposit 10 is simply placed on the surface of the wafer W. For this reason, when a gas cluster composed of a carbon dioxide gas is irradiated thereafter, the deposit 10 is easily removed.

In the fifth example embodiment, there has been explained a case where the deposit 10 is made of silicon oxide. However, if the deposit 10 is made of an organic material, ozone or ultraviolet rays are supplied (irradiated) to the wafer W in the pre-treatment, and if the deposit 10 is formed of a metal particle, a chlorine-based gas is supplied in the pre-treatment. Further, if the deposit 10 is made of silicon, as explained in the modification example of the first example embodiment, a surface of the deposit 10 may be first oxidized before the surface of the deposit 10 is etched. Furthermore, even if an inner portion of the deposit 10 is not made of the same material in a uniform manner, if a portion of the deposit 10 contains a material to be etched, the portion is etched and an adhesive strength of the deposit 10 with respect to the surface of the wafer W can be reduced in the same manner.

Figure 26:
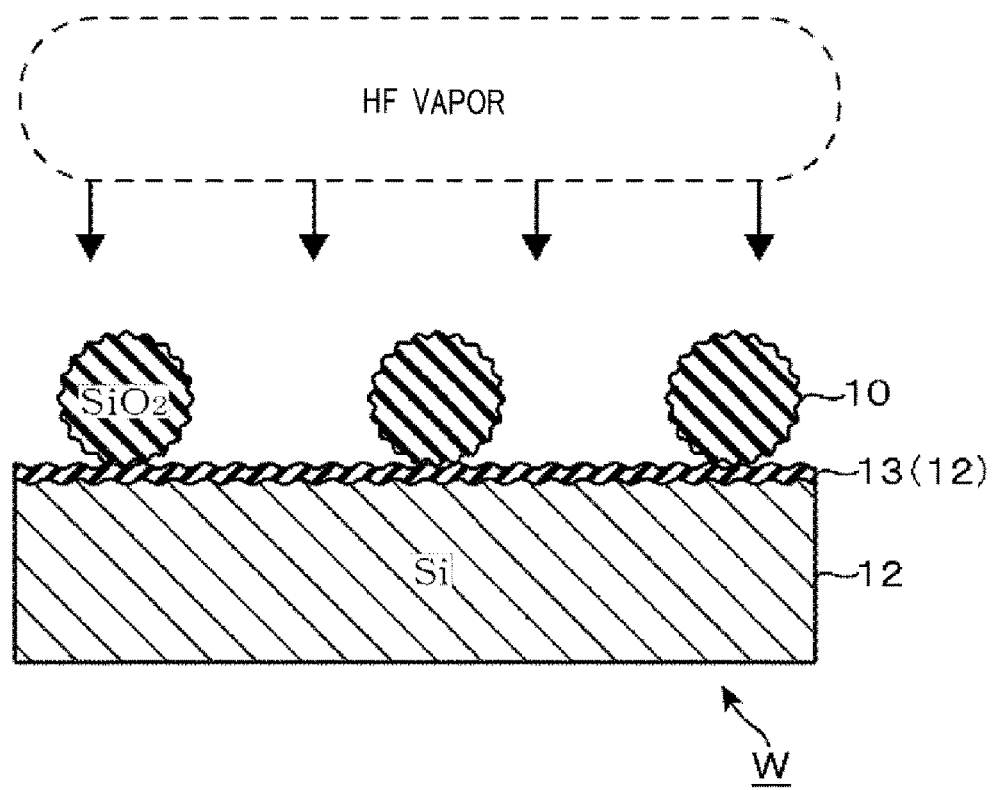
FIG. 26 is a schematic diagram showing an operation of the cleaning method in accordance with the fifth example embodiment.

Moreover, as depicted in FIG. 26, if the surface of the wafer W and the surface of the deposit 10 contain the same material, i.e., silicon oxide in the fifth example embodiment, the surface of the wafer W can be etched together with the surface of the deposit 10. Therefore, an adhesive strength of the deposit 10 can be further reduced.

As a gas cluster to be irradiated to the wafer W in the cleaning chamber 21, a carbon dioxide gas is used in each of the above-described example embodiments. However, as a gas used for a gas cluster, an inert gas, such as an argon (Ar) gas or a nitrogen ($N_2$) gas, that does not react with the underlying film 12 of the wafer W may be used or a mixture of such gases may be used instead of the carbon dioxide gas. Here, the gas cluster composed of the carbon dioxide gas has a greater size, i.e., a greater kinetic energy, than the argon gas or the nitrogen gas. For this reason, a deposit 10 can be more easily removed. Therefore, it is desirable to generate a gas cluster by using a carbon dioxide gas.

Further, as shown in an experimental example to be described below, an etching gas for etching the surface of the wafer W or the surface of the deposit 10 may be used together with the inert gas. That is, a gas cluster may be generated by using the inert gas and the etching gas to perform a pre-treatment (etching process) and remove the deposit 10 at the same time.

In each of the above-described example embodiments, there is provided only one nozzle 23 for irradiating a gas cluster to the wafer W in a cleaning process or a pre-treatment, but the multiple nozzles 23 may be provided. In this case, for example, above the wafer W, multiple nozzles 23 are arranged in a ring shape to be concentric with an outer periphery of the wafer W. Further, multiple irradiating units each including the multiple nozzles 23 arranged in the ring shape are concentrically arranged from a central portion of the wafer W toward the outer periphery thereof. Furthermore, if the multiple nozzles 23 are provided, they may be arranged in a grid shape above the wafer W.

There has been explained the processing apparatus including a device that performs a pre-treatment and a device that irradiates a gas cluster composed of a carbon dioxide gas. However, these devices may be separately provided as stand-alone devices, and the wafer W may be transferred between these devices by an external wafer arm.

Further, even if a gas cluster irradiated when the deposit 10 is removed is ionized, for example, at a low dissociation degree, such a case is included in the scope of the present example embodiment.

Experimental Example

Hereinafter, a result obtained from an experiment regarding the example embodiments will be explained. In the experiment, particles each having a diameter of about 23 nm and made of silicon oxide (silica) are injected to a bare silicon wafer to artificially contaminate the wafer. Then, when a process is performed under the following experimental conditions, a change in attachment status of the particles is checked.

(Experimental Conditions)

Comparative Example

Gas of gas cluster: Argon gas 100%
Gas inlet pressure to gas cluster nozzle: 0.899 MPaG (Gauge measurement value)

Experimental Example

Gas of gas cluster: Argon gas 95%+Hydrogen fluoride 5%
Gas inlet pressure to gas cluster nozzle: 0.85 MPaG (Gauge measurement value)

SEM (Scanning Electron Microscope) images are obtained before and after a gas cluster is irradiated in the comparative example, and are provided on the left and right sides, respectively, of FIG. 27. It can be seen from FIG. 27 that when the gas cluster of the argon gas is irradiated, the particles are hardly removed.

Meanwhile, SEM images obtained before and after a gas cluster is irradiated in the experimental example are provided on the left and right sides, respectively, of FIG. 28. It can be seen that after the gas cluster is irradiated, almost all the particles are removed. Therefore, it is found that with the gas cluster of the argon gas only, an adhesive strength between the particles and the wafer cannot be overcome, but by generating the gas cluster of the argon gas together with the hydrogen fluoride gas, the particles can be easily removed.

Accordingly, it can be found out that by the gas cluster of the hydrogen fluoride gas, the surface of the silica particle is etched as described above and an adhesive strength with respect to the wafer is reduced. For this reason, in the experimental example, even with the gas inlet pressure lower than that of the comparative example, the particles are easily removed. Although in the experimental example, the gas cluster is generated by using the argon gas together with the hydrogen fluoride gas, it can be seen that by mixing these gases, a pre-treatment and a cleaning process are performed at the same time, and more specifically, when the silica particles are etched, the silica particles are rapidly removed by the gas cluster of the argon gas. Therefore, it can be seen that even if a pre-treatment and a cleaning process are separately performed in this sequence, particles can be easily removed in the same manner as shown in the experimental example.

EXPLANATION OF REFERENCE NUMERALS

W: Wafer
7: Pattern
10: Deposit
11: Natural oxide film
12: Underlying film
13: Oxide film
14: Silicon layer
15: Germanium oxide film
16: Photoresist mask
17: Metal film
23: Nozzle

We claim:

1. A cleaning method of removing a deposit from a surface of a target object to which the deposit is attached and on which a pattern having grooves and lines is formed, the cleaning method comprising:
    exposing the target object into an atmosphere to form a natural oxide film on the target object;
    performing a pre-treatment including an etching process on at least one of the surface of the natural oxide film and the deposit and reducing adhesive strength of the deposit with respect to the surface of the natural oxide film;
    generating a gas cluster composed of a carbon dioxide gas, which does not react with the target object, by discharging the carbon dioxide gas to a processing gas atmosphere where the target object is placed, from a region having a higher pressure than the processing gas atmosphere and adiabatically expanding the carbon dioxide gas; and
    removing the deposit by irradiating the gas cluster composed of the carbon dioxide gas to the surface of the target object on which the pre-treatment is performed.

2. The cleaning method of claim 1,
wherein the performing of the pre-treatment and the removing of the deposit are performed at the same time.

3. The cleaning method of claim 1,
wherein the pre-treatment includes an irradiation process of irradiating a gas cluster of water vapor or etching gas to perform the etching process.

4. The cleaning method of claim 1,
wherein, in the removing of the deposit by irradiating the gas cluster composed of the carbon dioxide gas, multiple generating devices each irradiating the gas cluster are provided, and the gas cluster is irradiated from the generating devices.

5. The cleaning method of claim 3,
wherein the irradiation process of irradiating the gas cluster to perform the etching process is performed by using a generating device identical to a generating device that irradiates the gas cluster in the removing of the deposit by irradiating the gas cluster composed of the carbon dioxide gas.

6. The cleaning method of claim 3,
wherein the irradiation process of irradiating the gas cluster to perform the etching process is performed by using a generating device which is separated from a generating device that irradiates the gas cluster in the removing of the deposit by irradiating the gas cluster composed of the carbon dioxide gas.

7. The cleaning method of claim 3,
wherein, in the irradiation process of irradiating the gas cluster to perform the etching process, multiple generating devices each irradiating the gas cluster are provided, and the gas cluster is irradiated from the generating devices.

8. The cleaning method of claim 3,
wherein, in the irradiation process of irradiating the gas cluster to perform the etching process, an angle of a generating device that irradiates the gas cluster with respect to the target object is variable.

9. The cleaning method of claim 1,
wherein, in the removing of the deposit by irradiating the gas cluster composed of the carbon dioxide gas, an angle of a generating device that irradiates the gas cluster with respect to the target object is variable.

* * * * *